(12) United States Patent
Kim et al.

(10) Patent No.: US 7,615,446 B2
(45) Date of Patent: Nov. 10, 2009

(54) CHARGE TRAP FLASH MEMORY DEVICE, FABRICATION METHOD THEREOF, AND WRITE/READ OPERATION CONTROL METHOD THEREOF

(75) Inventors: Tae-whan Kim, Seoul (KR); Young-ho Kim, Seoul (KR); Jae-ho Kim, Seoul (KR); Jea-hun Jung, Seoul (KR); Chong-seung Yoon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 201 days.

(21) Appl. No.: 11/580,102

(22) Filed: Oct. 13, 2006

(65) Prior Publication Data

US 2007/0102750 A1    May 10, 2007

(30) Foreign Application Priority Data

Oct. 13, 2005  (KR) .................. 10-2005-0096552
Dec. 19, 2005  (KR) .................. 10-2005-0125643

(51) Int. Cl.
    *H01L 21/336*    (2006.01)

(52) U.S. Cl. .................. 438/257; 438/197; 438/264; 257/314; 257/315

(58) Field of Classification Search .................. 438/197, 438/257, 264, 593; 257/314, 315, 316
See application file for complete search history.

(56) References Cited

U.S. PATENT DOCUMENTS

| | | | |
|---|---|---|---|
| 7,208,793 B2* | 4/2007 | Bhattacharyya | 257/314 |
| 7,355,238 B2* | 4/2008 | Takata et al. | 257/314 |
| 7,429,767 B2* | 9/2008 | Bhattacharyya | 257/324 |
| 2004/0004245 A1 | 1/2004 | Forbes et al. | |
| 2005/0146938 A1 | 7/2005 | Forbes | |
| 2006/0060841 A1* | 3/2006 | Kim et al. | 257/40 |
| 2006/0127266 A1* | 6/2006 | Miura et al. | 419/32 |
| 2007/0026689 A1* | 2/2007 | Nakata et al. | 438/781 |

FOREIGN PATENT DOCUMENTS

| | | |
|---|---|---|
| GB | 2325546 A | 11/1998 |
| KR | 1998-087237 | 12/1998 |
| KR | 1020050096224 A | 10/2005 |
| WO | WO 2005/093837 | 10/2005 |
| WO | WO 2006/083068 | 8/2006 |

* cited by examiner

*Primary Examiner*—Phuc T Dang
(74) *Attorney, Agent, or Firm*—Volentine & Whitt, P.L.L.C.

(57) ABSTRACT

In one aspect, a charge trap flash memory device is provided which includes a semiconductor substrate, source and drain regions which are spaced apart in an active region of the semiconductor substrate to define a channel region therebetween, a tunneling dielectric layer located on the channel region, an organic polymer thin film located on the tunneling dielectric layer, metal or metal oxide nano-crystals embedded in the organic polymer thin film, and a gate located on the organic polymer thin film.

17 Claims, 20 Drawing Sheets

CHARGE TRAP FLASH MEMORY DEVICE, FABRICATION METHOD THEREOF, AND WRITE/READ OPERATION CONTROL METHOD THEREOF

BACKGROUND OF THE INVENTION

1. Field of the Invention

The present invention generally relates to memory devices, and more particularly, the present invention relates charge trap flash memory device, a method of fabricating a charge trap flash memory device, and a write/read operation control method of a charge trap flash memory device.

A claim of priority is made to Korean Patent Application Nos. 10-2005-0096552 and 10-2005-0125643 filed Oct. 13, 2005, and Dec. 19, 2005, respectively, in the Korean Intellectual Property Office, the disclosures of which are incorporated herein by reference in their entirety.

2. Description of the Related Art

Flash memory combines advantages offered by an EPROM (Erasable Programmable ROM) and an EEPROM (Electrically Erasable Programmable ROM), including a significantly reduced cell area and electrical erasability. Unlike an EEPROM, however, flash memory cells can be erased and reprogrammed in blocks in a single operation, thereby offering faster erase and access operations.

A flash memory device is fabricated by sequentially laminating on a silicon substrate a thin tunnel oxide layer, a floating gate made of polysilicon, an integrated dielectric layer, and a control gate electrode to which a predetermined voltage is applied.

The floating gate of a commercially available flash memory device is generally made of polysilicon. However, a conventional polysilicon floating gate structure presents several limitations in achieving ultra-thin, large-scale devices, due to interference between memory cells, inefficiency of an increased number of operation steps, and so on.

As one of alternative attempts to achieve ultra-thin, large-scale devices, a method of forming Si nano-particles in an Si oxide film has been proposed. However, since the proposed method is based on ion implementation, the process is quite complex and only a small number of devices can be fabricated in an extremely high degree of clean environment, it is quite difficult to realize mass production and commercialization of the devices. Thus, the Si nano-particles for use in the conventional flash memory may decrease the fabrication efficiency and increase the fabrication cost.

Further, in order to enable a flash memory device using Si nano-particles to operate in multiple levels, which is necessary to store a large amount of information without increasing a device area, complicated peripheral circuits and an operation mechanism for accurately controlling write operation are required.

SUMMARY OF THE INVENTION

According to an aspect of the present invention, a charge trap flash memory device is provided which includes a semiconductor substrate, source and drain regions which are spaced apart in an active region of the semiconductor substrate to define a channel region therebetween, a tunneling dielectric layer located on the channel region, an organic polymer thin film located on the tunneling dielectric layer, metal or metal oxide nano-crystals embedded in the organic polymer thin film, and a gate located on the organic polymer thin film.

According to another aspect of the present invention, a charge trap flash memory device is provided which includes a semiconductor substrate, source and drain regions which are spaced apart in an active region of the semiconductor substrate to define a channel region therebetween, an organic polymer thin film located on the tunneling dielectric layer, multiple layers of metal or metal oxide nano-crystals embedded in the organic polymer thin film, and a gate located on the organic polymer thin film.

According to still another aspect of the present invention, a method of fabricating a charge trap flash memory device is provided, where the method includes forming a tunneling dielectric layer on a semiconductor substrate, forming an organic polymer thin film having metal or metal oxide nano-crystals embedded therein on the tunneling dielectric layer, forming a gate layer on the organic polymer thin film, and patterning the gate layer, the organic polymer thin film and the tunneling dielectric layer and forming source and drain regions in the semiconductor substrate.

According to a further aspect of the present invention, a method of fabricating a charge trap flash memory device is provided, where the method includes forming an organic polymer thin film including multiple layers of metal or metal oxide nano-crystals embedded therein on a semiconductor substrate, forming a gate layer on the organic polymer thin film, and patterning the gate layer and the organic polymer thin film and forming source and drain rep-ions in the semiconductor substrate.

According to yet another aspect of the present invention, a method is provided of controlling a multi-level charge trap flash memory device having programmable voltage thresholds which define storage states '00', '01', '10' and '11' of the memory device. The method includes applying a write voltage of the state '10' to a gate of the memory device to cause the memory device to store the state '10', wherein the memory device is initialized in the state '11' prior to application of the write voltage of the state '10', applying a write voltage of the state '01' to the gate to cause the memory device to store the state '01', and applying a write voltage of the state '00' to the gate to cause the memory device to store the state '00'.

BRIEF DESCRIPTION OF THE DRAWINGS

The above and other features and advantages of the present invention will become readily apparent from the detailed description that follows, with reference to the accompanying drawings, in which.

DETAILED DESCRIPTION OF EMBODIMENTS

Figure 1A:
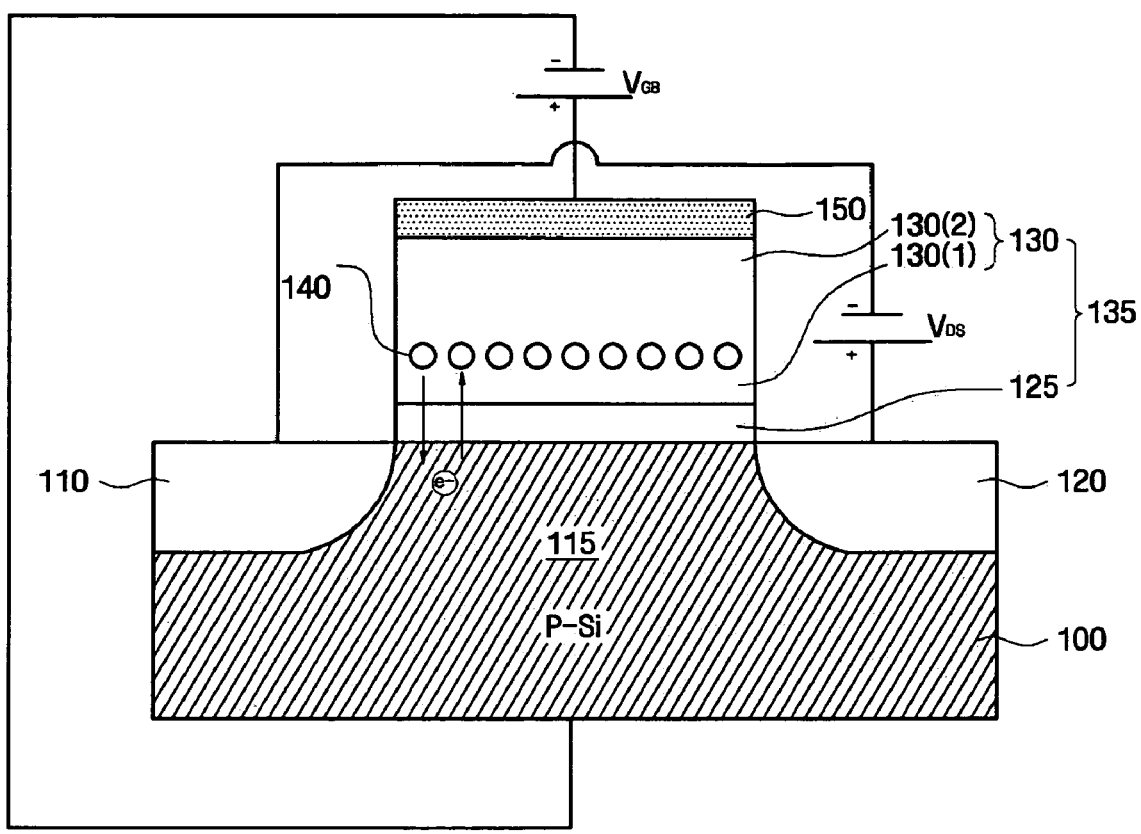
FIGS. 1A and 1B are cross-sectional views of single-level charge trap flash memory devices according to exemplary embodiments of the present invention.

Advantages and features of the present invention will become understood by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concepts of the invention to those skilled in the art. The present invention is defined by the appended claims, and not by the disclosed embodiments.

In the description that follows, well-known processing steps are generally not described in detail in order to avoid unnecessarily obscuring the description of the disclosed embodiments.

It is noted that the use of any and all exemplary terms provided herein is intended merely to better illuminate the invention and is not a limitation on the scope of the invention unless otherwise specified. The use of the terms "a" and "an" and "the" and similar referents in the context of describing the invention (especially in the context of the appended claims) are to be construed to cover both the singular and the plural, unless otherwise indicated herein or clearly contradicted by context. The terms "comprising" and "comprises" are to be construed as open-ended terms (i.e., meaning "including, but not limited to,") to indicate any and all possible combinations of one or more of the associated components, steps, operations, and/or devices unless otherwise noted. It will also be understood that the term "and/or" as used herein refers to and encompasses any and all possible combinations of one or more of the associated listed items. In the drawings, like reference numerals denote like members.

In addition, the present invention will be described with reference to perspective views, cross-sectional views, and/or plan views, in which preferred embodiments of the invention are shown. Thus, the profile of an exemplary view may be modified according to manufacturing techniques and/or allowances. Thus, regions shown in the drawings are illustrated in schematic form and the shapes of the regions are presented simply by way of illustration and not as a limitation. In addition, in the drawings, the thickness of layers and regions are exaggerated for clarity.

Throughout the disclosure and appended claims, it will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

As will be described below, each of charge trap flash memory devices according to exemplary embodiments of the present invention includes a metal or metal oxide nano-crystals embedded in a polymer thin film.

Figure 1B:
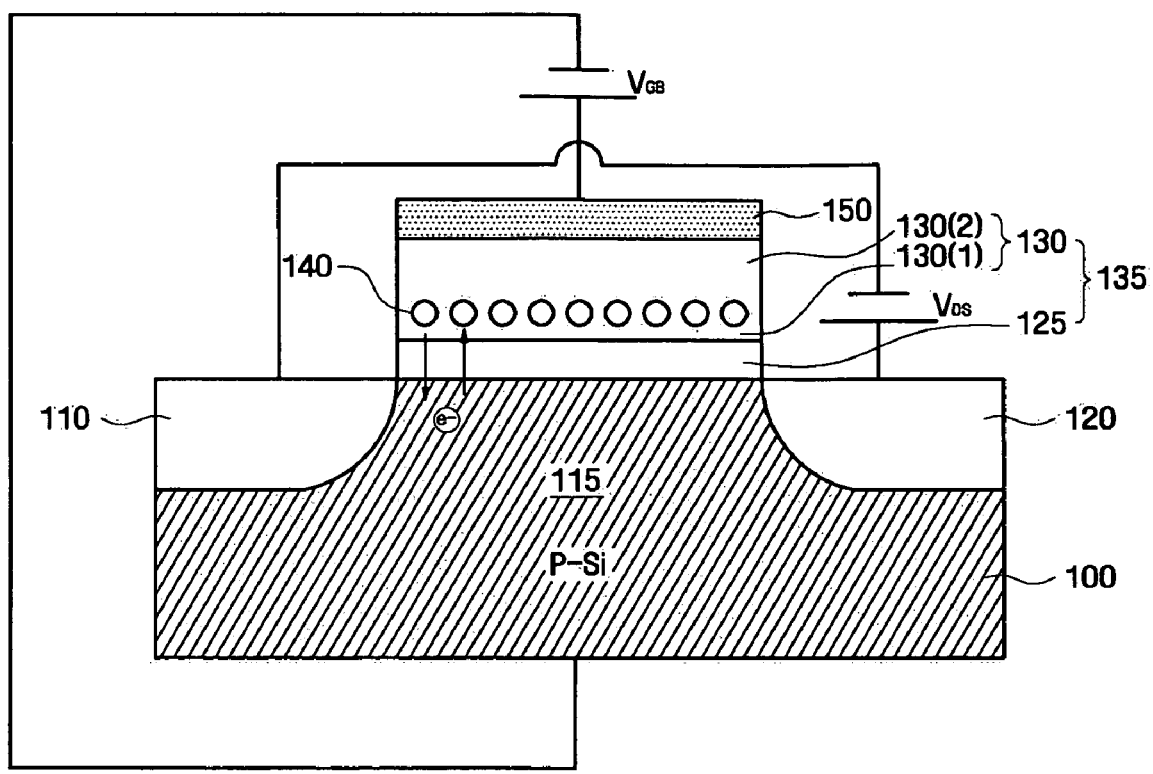

FIGS. 1A and 1B are cross-sectional views of single-level charge trap flash memory devices according to exemplary embodiments of the present invention.

Referring to FIGS. 1A and 1B, the single-level charge trap flash memory devices according to exemplary embodiments of the present invention include a substrate 100, a source region 110 and a drain region 120, a channel region 115 formed between the source region 110 and the drain region 120, a stacked insulating layer 135 formed on the channel region 115, and a gate 150 formed on the stacked insulating layer 135.

The substrate 100 may be a typical substrate generally used in the manufacture of a semiconductor device. The substrate 100 may be an N-type impurity doped silicon (Si) substrate or a p-type impurity doped Si (hereinafter, simply referred to as P—Si) substrate. Specifically, the P—Si substrate provides several advantages, including (1) the capability of effectively trapping/emitting electrons to/from an inversion layer; and (2) the relatively high mobility of electrons.

The source region 110 and the drain region 120 may be n-type source and drain formed through implantation of VI-group elements, e.g., phosphorus (P).

As shown in FIGS. 1A and 1B, the stacked insulating layer 135 includes a tunneling dielectric layer 125 and an organic polymer thin film 130, and nano-crystals 140 embedded in the organic polymer thin film 130.

The tunneling dielectric layer 125 may increase a retention time of charges trapped into the nano-crystal 140 and may be formed of a more electrochemically stable material than the organic polymer thin film 130. The tunneling dielectric layer 125 may be a silicon oxide layer. Alternatively, as examples, the tunneling dielectric layer 125 may be a metal oxide layer, an alloy oxide layer, a metal oxynitride layer, or an alloy oxynitride layer. In particular, the tunneling dielectric layer 125 may be made of a single metal oxide, for example, a III-group metal oxide such as Sc, Y or La oxide, a IV-group metal oxide such as Zr, Hf or Ti oxide, or a XIII-group metal oxide such as Al oxide, or an alloy metal oxide. These materials can be represented by the general formulae $A_xO_y$, $A_xB_{1-x}O_y$, $A_xO_yN_z$, or $A_xB_{1-x}O_yN_z$, in which A and B are independently different materials selected from the group consisting of Ti, Zr, Hf, Sc, Y, La and Al. The thickness of the tunneling dielectric layer 125 may, as examples, be less than about 8 nm, or within a range of from about 4 nm to about 8 nm.

The organic polymer thin film 130 may be a polyimide thin film. The organic polymer thin film 130 may be formed by hardening polyamic acid of biphenyltetracaboxylic dianhydide-p-phenylenediamine (BPDA-PDA) (commercially available in the trade name of PI2610D by DuPont).

For purposes of description, the organic polymer film 130 includes a lower portion 130(1) located between the nano-crystals 140 and the tunneling dielectric layer 125, and an upper portion 130(2) located between the nano-crystals 140 and the gate 150. The greater the thickness of the stacked insulating layer 135 between the nano-crystals 140 and the channel region 115, that is, the sum of thicknesses of the tunneling dielectric layer 125 and the lower portion 130(1) of the organic polymer thin film 130, the smaller the leakage current will be and the longer the charges trapped into the nano-crystal 140 can be stored. On the other hand, as the sum of thicknesses of the tunneling dielectric layer 125 and the lower portion 130(1) of polymer thin film 130 increases, a voltage to be externally applied for coupling must be increased, resulting in an increase of the overall operating voltage. Thus, by taking these factors into consideration, optimal thicknesses of the tunneling dielectric layer 125 and the organic polymer thin film 130(1) can be determined.

The nano-crystals 140 may be metal or metal oxide nano-crystals. The metal or metal oxide nano-crystals preferably include at least one of copper oxide ($Cu_2O$), zinc oxide (ZnO), or nickel iron ($Ni_{1-x}Fe$) ($0<x<0.5$). In particular, when nickel iron is used as a material for forming metal nano-crystals, x is preferably 0.2. To enable the nano-crystals 140 to trap or emit electrons, an externally applied voltage can be adjusted by controlling the size and density of the nano-crystals 140. The nano-crystals 140 may be embedded into the organic polymer thin film 130 such that nano-crystals are distributed primarily around an interfacial area between the tunneling dielectric layer 125 and the organic polymer thin film 130, as shown in FIG. 1A. Alternatively, the nano-crystals 140 may be embedded into the organic polymer thin film 130 such that nano-crystals are spaced a predetermined distance apart from the tunneling dielectric layer 125, as shown in FIG. 1B.

The gate 150 may, for example, be a metal gate such as Al or TaN gate.

Fabrication of the single-level charge trap flash memory devices shown in FIGS. 1A and 1B will now be described. In the description that follows, the organic polymer thin film 130 is made of polyimide by way of example. The manufacture of an organic polymer thin film having nano-crystals embedded therein is disclosed in PCT Publication No. WO2005/093837 and PCT Publication No. WO2006/083068 commonly assigned to the assignees of the present invention, the disclosures of which are hereby incorporated by reference as fully set forth herein.

First, the tunneling dielectric layer 125 is formed on the semiconductor substrate 100 from which impurities and native oxide have been removed, e.g., P—Si substrate. Here, the formation of the tunneling dielectric layer 125 may be performed by thermally oxidizing the semiconductor substrate 100 or depositing a silicon oxide layer, a metal oxide layer, an alloy oxide layer, a metal oxynitride layer, or an alloy oxynitride layer on the semiconductor substrate 100 by Atomic Layer Deposition (ALD) or Plasma Enhance Chemical Vapor Deposition (PECVD).

To fabricate the single-level charge trap flash memory devices shown in FIG. 1A, a metal film may be formed directly on the tunneling dielectric layer 125. The metal film is a potential element for forming the nano-crystals 140 in a subsequent process. The thickness of the metal film may be determined according to the type of metal used for producing the nano-crystals 140, the thickness of the organic polymer thin film 130, the mixing ratio of a solvent and BPDA-PDA constituting a precursor of the organic polymer thin film 130, and the hardening process conditions. The thickness of the metal film is preferably in a range of from about 10 nm to about 100 nm, more preferably about 5 nm. Examples of materials used for the metal film include Cu, Zn, and $Ni_{1-x}Fe_x$ ($0<x<0.5$). The metal film may be deposited by a sputtering method, for example, but the fabrication method is not limited thereto. The sputtering method may be a Physical Vapor Deposition (PVD) method commonly known in the field of thin film deposition technology in which a target material is physically deposited on a substrate. In an exemplary PVD method, Ar gas is injected into a vacuum chamber while supplying a metal target with power, so that plasma is produced in the chamber. As a result, Ar+ ions violently collide with the metal target to cause metallic atoms to be physically deposited on the substrate.

To fabricate the single-level charge trap flash memory device shown in FIG. 1B, prior to the formation of the metal film, an acidic precursor film of the organic polymer thin film 130 is formed on the tunneling dielectric layer 125. The acidic precursor film may be made of polyimide. The polyimide acidic precursor film may be formed by applying polyamic acid prepared by dissolving BPDA-PDA in a solvent selected from the group consisting of N-methyl-2-pyrrolidone (NMP), water, N-dimethylacetamide, and diglyme, in a mixture ratio of 1:3 by weight to the resultant product having the tunneling dielectric layer 125 formed on the semiconductor substrate 100 using a spin coating method, for example, and removing the solvent from the reactant mixture. Here, a variety of known film formation methods may be employed in addition to the spin coating method. Removal of the solvent can be performed through annealing at about 135° C. for about 30 minutes, but the annealing temperature and time may both be modified.

The formation of the metal film is followed by spin-coating the precursor film of the organic polymer thin film 130, e.g., polyamic acid, on the metal film and storing the resultant product at room temperature. The resultant product may be stored at room temperature for about 24 hours, but the storage time may vary according to the kind, density and size of the nano-crystal 140 intended to be formed. After the spin-coating, storing the resultant product for a predetermined duration of time allows the nano-crystal 140 to be efficiently formed, compared to a case where the spin-coating is immediately followed by the removal of the solvent.

Next, an annealing process is performed. In the annealing process, the precursor film of the organic polymer thin film 130 is hardened and converted into polyimide, thereby completing the organic polymer thin film 130 with the nano-crystal 140 uniformly distributed in the organic polymer thin film 130. The annealing conditions may vary according to the kind of the metal film. For example, when a copper film or a zinc film is used as the metal film, the annealing process may be performed at about 350° C. for about 2 hours under $10^{-3}$ Pa. In addition, when a nickel iron film is used as the metal film, the annealing process may be performed at about 400° C. for about 1 hour. That is to say, the nano-crystal 140 can be formed to a desired size by comparatively adjusting annealing temperature and time.

In the above-described charge trap flash memory devices, the thicknesses of a lower portion 130(1) of the organic polymer thin film 130 and the tunneling dielectric layer 125 are controlled by controlling processing conditions of various operation steps such that the thicknesses of the lower portion 130(1) of the organic polymer thin film 130 and the tunneling dielectric layer 125 are, as examples, in a range of from about 1 nm to about 10 nm and the thickness of the nano-crystal 140 is, as an example, in a range of from about 4 nm to about 6 nm.

Next, patterning of the organic polymer thin film 130 having the nano-crystal 140 embedded therein and forming of the source 110, the drain 120 and the gate 150 can be performed in various manners using methods and processes well known to one skilled in the art and will be described briefly so as not to unnecessarily obscure aspects of the present invention.

Figure 2:
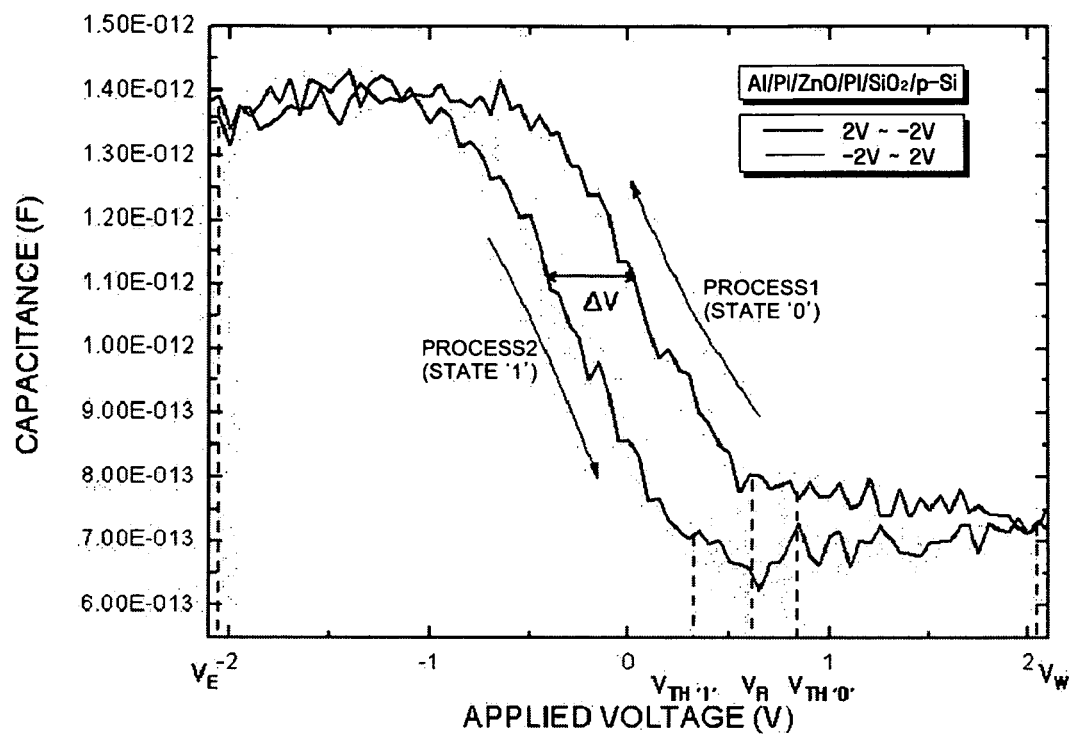
FIG. 2 is a graph illustrating capacitance-versus-voltage (C-V) characteristic curves associated with write, read and erase operations in the charge trap flash memory devices illustrated in FIGS. 1A and 1B.

FIG. 2 is a graph illustrating the capacitance-versus-voltage (C-V) characteristic curve associated with write, read and erase operations in the charge trap flash memory devices illustrated in FIGS. 1A and 1B. Here, an Al electrode, a polyimide (PI) film, nano-crystals, a PI film, a silicone oxide film, and a P—Si substrate are stacked sequentially in order from top to bottom.

Referring to FIG. 2, when a voltage changing from 2 V to −2 V is applied to a region between the gate 150 and the semiconductor substrate 100, the C-V characteristic curve is indicated by a plot referred to as a PROCESS 1 (STATE '0'). When a voltage changing from −2 V to 2 V is applied to the region between the gate 150 and the semiconductor substrate 100, the C-V characteristic curve is indicated by a plot referred to as a PROCESS 2 (STATE '1'). Assume that a write voltage $V_{Write}$ ($V_W$), a read voltage $V_{Read}$ ($V_R$), and an erase voltage $V_{Erase}$ ($V_E$) are set to 2 V, an arbitrary voltage in a range of from 0 V to 1 V, and −2 V, respectively. In the description that follows, the respective processes and states will be explained in greater detail.

Figure 3A:
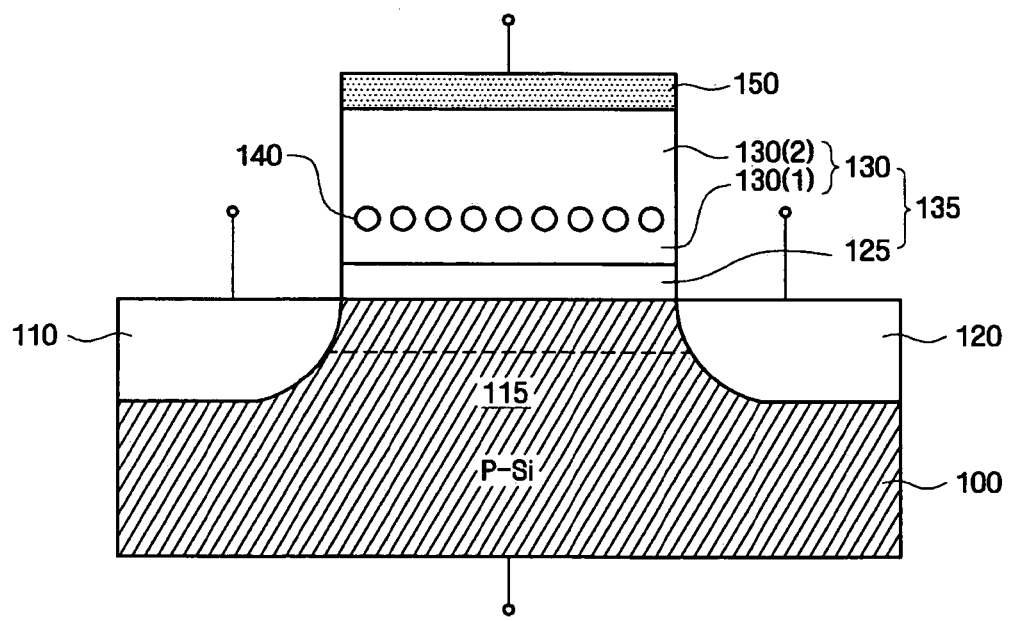
FIGS. 3A, 4A, 5A, 6A and 7A are cross-sectional views for describing write, read and erase operations in a single-level charge trap flash memory device according to an exemplary embodiment of the present invention, respectively.
Figure 3B:
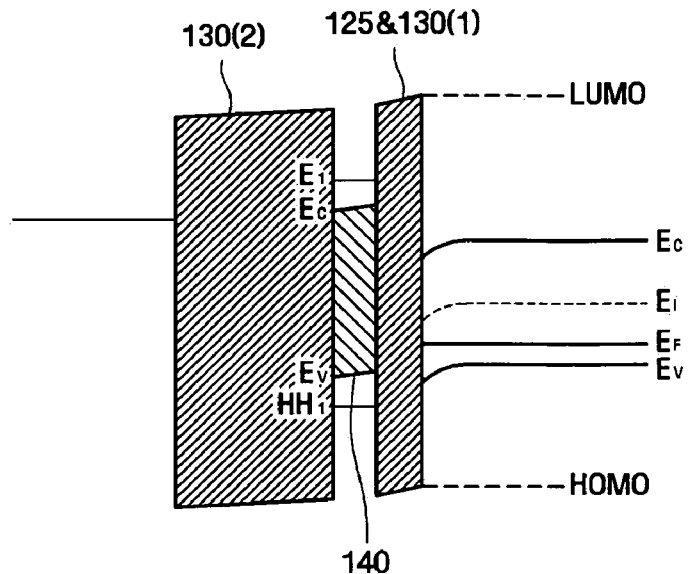
FIGS. 3B, 4B, 5B, 6B and 7B are energy band diagrams for describing the write, read and erase operations associated with FIGS. 3A, 4A, 5A, 6A and 7A, respectively.

FIG. 3A is a cross-sectional view of a single-level charge trap flash memory device according to an exemplary embodiment of the present invention when no voltage is applied thereto, and FIG. 3B is an energy band diagram of the single-level charge trap flash memory device shown in FIG. 3A. Referring to FIGS. 3A and 3B, no electrons are present in nano-crystals 140 embedded in the organic polymer thin film 130, e.g., a polyimide film. In FIG. 3B, LUMO indicates the lowest electron unoccupied molecular orbital energy level, HOMO indicates the highest electron occupied molecular orbital energy level, $E_c$ indicates the lowest energy level in a conduction band, $E_v$ indicates the highest energy level in the conduction band, E1 indicates an energy level of a quantized ground state produced in the conduction band, HH1 indicates an energy level of a ground state of a quantized hole produced in a valence band, $E_1$ indicates a Fermi energy level of an intrinsic semiconductor, i.e., a pure semiconductor material without impurity doped thereto, a probability of electrons present at $E_1$ being accurately ½, and EF indicates a Fermi energy level of a semiconductor doped with impurity for generating carriers. In a case of a pure Si semiconductor substrate without impurity dopants, $E_1$ is positioned around the center of the energy gap. EF is positioned in the vicinity of the valence band in a case of a P—Si substrate, while being positioned in the vicinity of the conduction band in a case of an N—Si substrate.

Figure 4A:
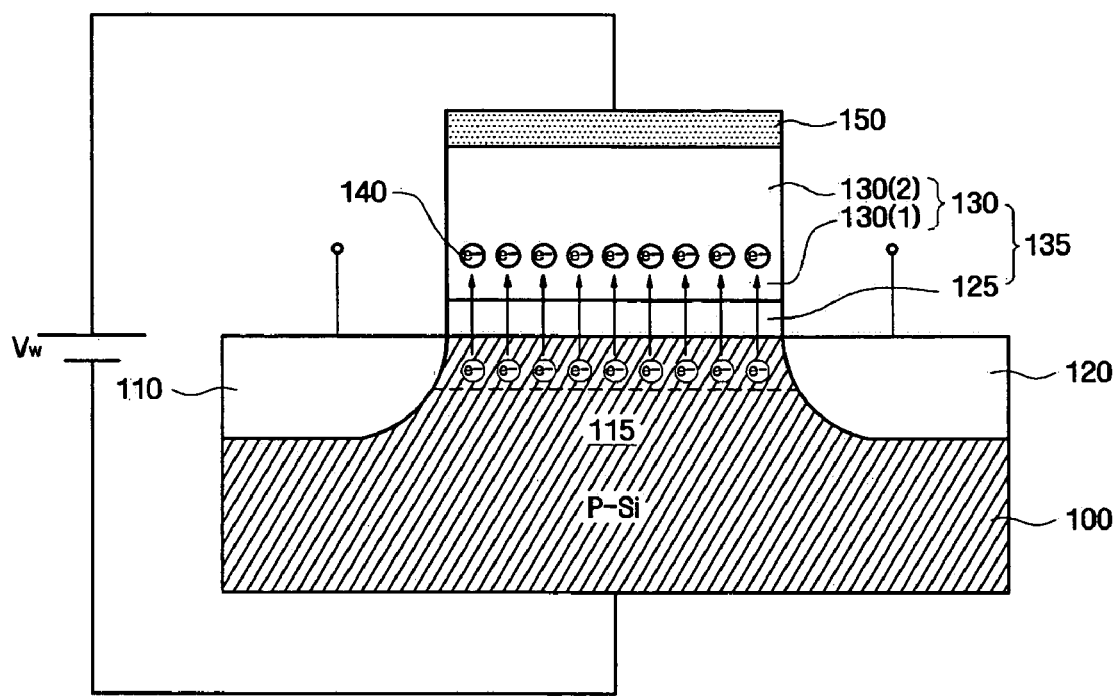
Figure 4B:
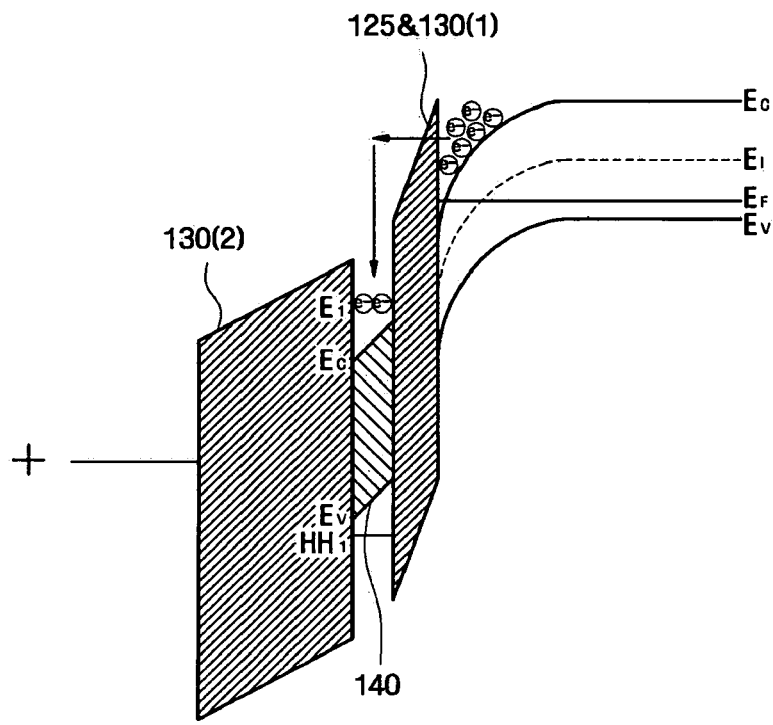

FIG. 4A is a cross-sectional view of a single-level charge trap flash memory device according to an exemplary embodiment of the present invention when a write voltage $V_W$ is applied thereto and FIG. 4B is an energy band diagram of the single-level charge trap flash memory device shown in FIG. 4A. Referring to FIGS. 4A and 4B, when a source region 110 and a drain region 120 are allowed to float and the write voltage $V_W$ is applied to two opposite terminals of a gate 150 and a P—Si substrate 100, an inversion layer is formed on the P—Si substrate 100. Electrons created at the inversion layer are trapped in the nano-crystals 140 embedded in the organic polymer thin film 130 through Fowler-Nordheim tunneling. Here, tunneling is a phenomenon in which particles with low energy become able tunnel through an energy barrier due to quantum effect as the thickness of the energy barrier decreases. The tunneling phenomenon cannot be elucidated by classical mechanics but can only be explained by quantum mechanics. Tunneling is largely classified into direct tunneling or Fowler-Nordheim tunneling. Direct tunneling occurs when the shape of an energy barrier is rectangular (i.e., when an external electric field is weak). Fowler-Nordheim tunneling occurs when the shape of an energy barrier changes from a rectangle to a triangle as the external electric field applied to the energy barrier becomes strong. Even though a thickness of the energy barrier has not physically changed, the change in the shape of the energy barrier provides particles undergoing Fowler-Nordheim tunneling with substantially the same effect as having reduced the thickness of the energy barrier. Accordingly, in a given electric field, a current generated by Fowler-Nordheim tunneling is higher than a current generated by direct tunneling. In general, both Fowler-Nordheim tunneling and direct tunneling occur in a device. In other words, when an external electric field is weak, particles are implanted by direct tunneling, and as the external electric field becomes strong, particles are implanted by Fowler-Nordheim tunneling.

Since a region between the nano-crystals 140 and the gate 150, i.e., the region between upper portion 130(2) of the organic polymer thin film 130 and the tunneling dielectric layer 125 is relatively thicker than a region between the nano-crystals 140 and the P—Si substrate 100, i.e., at the region between the lower portion 130(1) of the organic polymer thin film 130 and the substrate 100 there is no probability that the electrons which are trapped into the nano-crystals 140 are tunneled back to the gate 150 at a given voltage level. Then, even if an externally applied voltage is removed, the electrons which are trapped into the nano-crystal 140 can be held in a state in which they are trapped into the nano-crystal 140 because the organic polymer thin film 130, i.e., a polyimide thin film, serves an insulator. A hysteresis characteristic is observed in the C-V characteristic curve due to an internal electric field generated by the trapped electrons, as referred to as 'PROCESS 1' in FIG. 2.

Figure 5A:
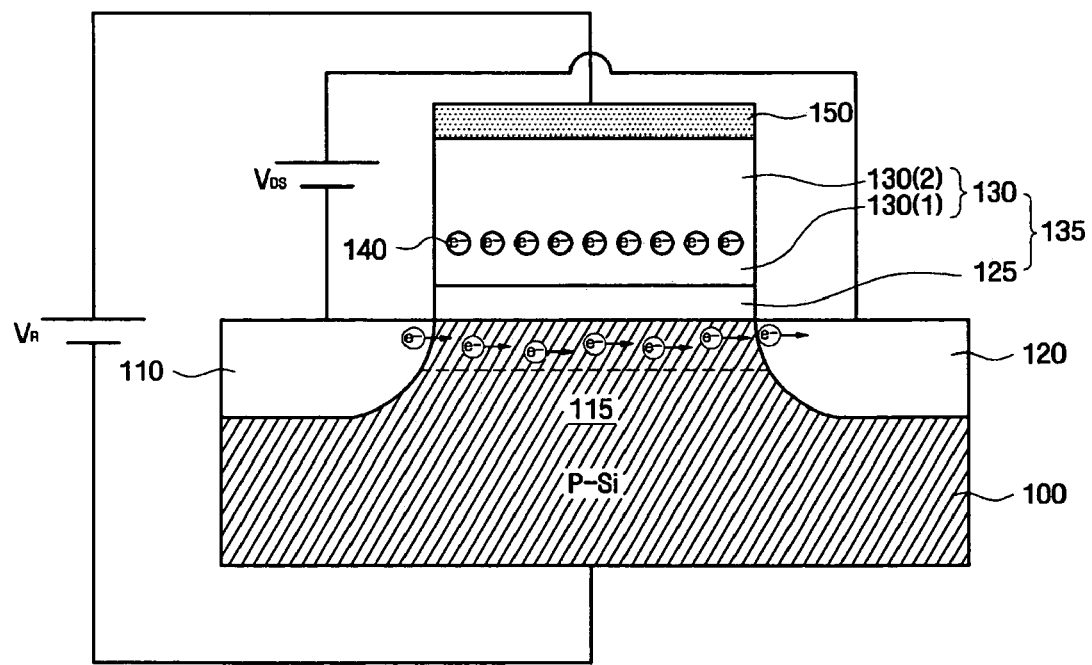
Figure 5B:
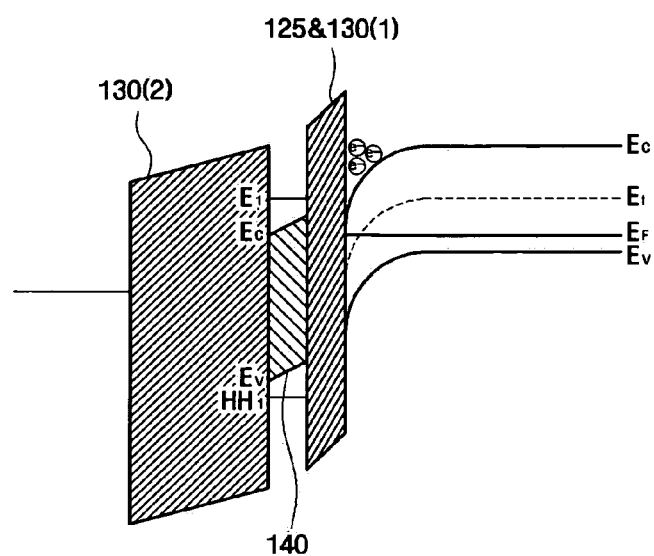
Figure 6A:
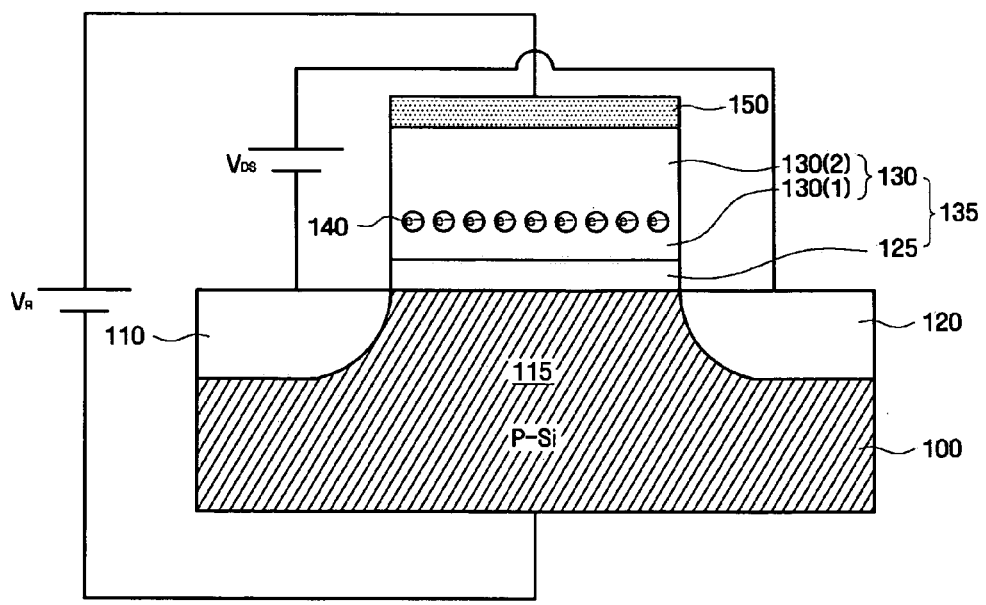
Figure 6B:
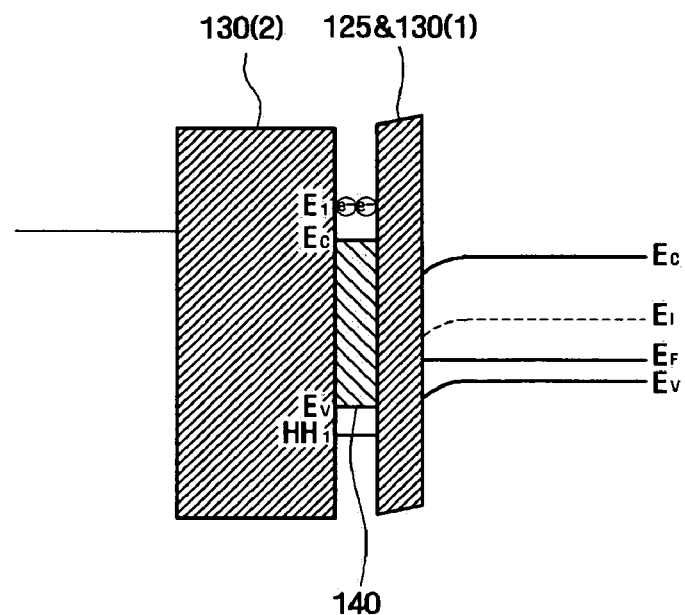

FIGS. 5A and 6A are cross-sectional views of single-level charge trap flash memory devices according to exemplary embodiments of the present invention when a read voltage $V_R$ is applied thereto, and FIGS. 5B and 6B are energy band diagrams of the single-level charge trap flash memory devices shown in FIGS. 5A and 6A. Referring to FIGS. 5A and 6A, the read voltage $V_R$ is applied to two opposite terminals of the gate 150 and the P—Si substrate 100. Then, a predetermined voltage $V_{DS}$ is applied to the source region 110 and the drain region 120. A determination as to whether a device is in a state '1' or '0' is made depending on the presence or absence of electrons trapped in a nano-crystals 140 embedded in the organic polymer thin film 130. The present embodiment will be described below based on assumptions that the state '1' indicates a case where electrons are not trapped in the nano-crystals 140 and the state '0' indicates a case where electrons are trapped in the nano-crystal 140.

Referring to FIGS. 5A and 5B, when electrons are not trapped in the nano-crystal 140, the memory device is in a neutral state. To form a channel, the memory device is initially set to a threshold voltage $V_{TH'1'}$, which is lower than the read voltage $V_R$ applied to the two opposite terminals of the gate 150 and the P—Si substrate 100. With the application of the read voltage $V_R$, the energy level sharply changes so as to form an inversion layer on the P—Si substrate 100, as shown in FIG. 5B. Accordingly, a channel through which electrons move from the source region 110 to the drain region 120 is formed and a drain current flows through the channel, which can be defined as a state '1'.

Referring to FIGS. 6A and 6B, together with FIG. 2, if electrons are trapped in the nano-crystals 140 through a write operation, the threshold voltage $V_{TH'1'}$ of the memory device rises to $V_{TH'0'}$, so that the read voltage $V_R$ becomes smaller than the new threshold voltage $V_{TH'0'}$. In this case, a change in the energy level is not large enough to form a channel, as shown in FIG. 6B. Accordingly, even if a predetermined voltage $V_{DS}$ is applied to the source region 110 and the drain region 120, a drain current does not flow. This state can be defined as a state '0'.

While a state in which the drain current flows has been defined as the state '1' and a state in which the drain current flows has been defined as the state '0' in the foregoing description, it will be apparent to those skilled in the art that the invention can be readily applied to defining those states in a reverse manner.

Figure 7A:
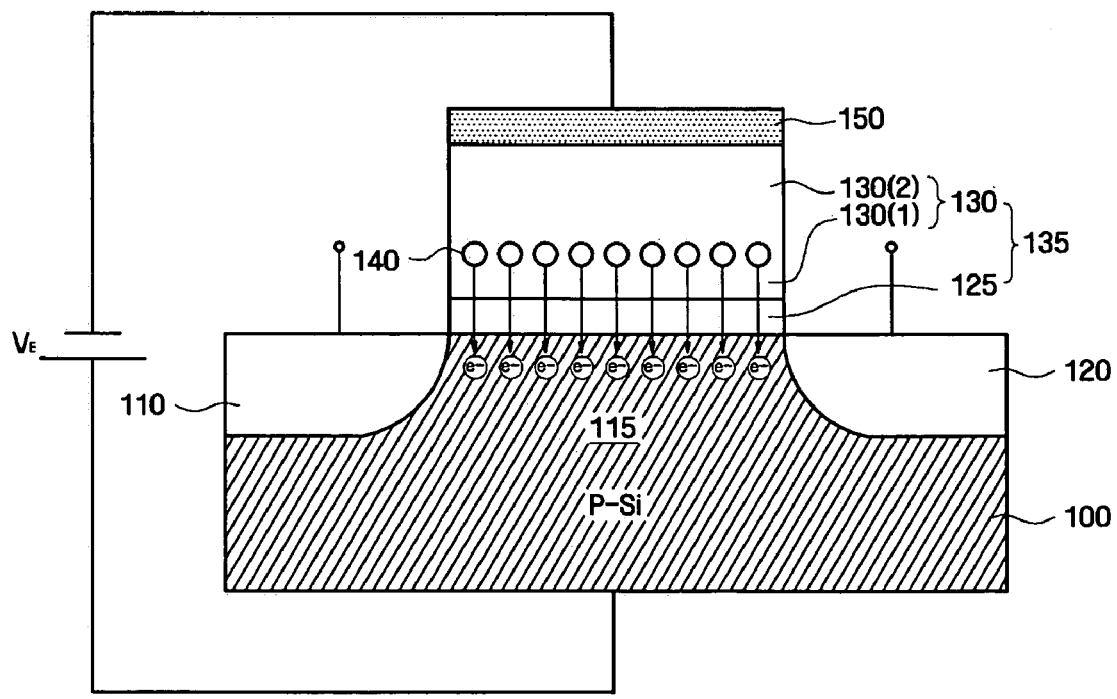
Figure 7B:
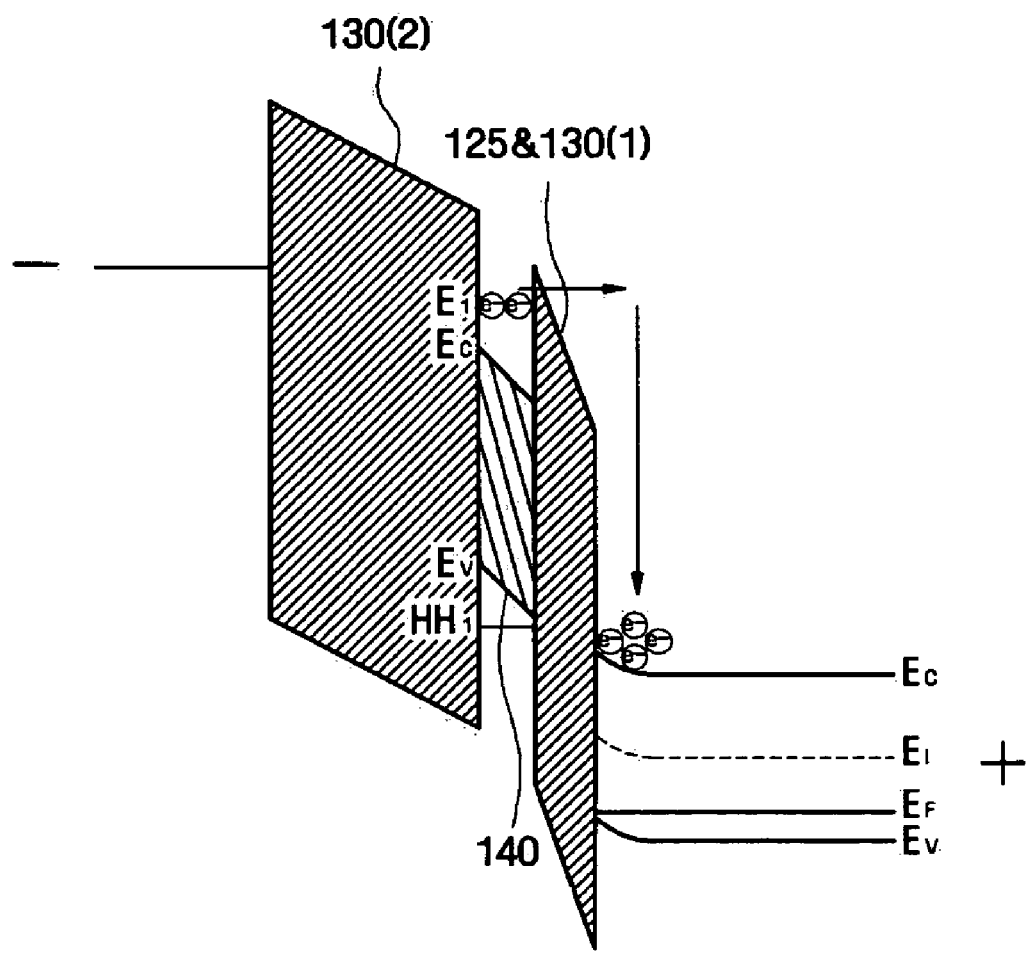

FIG. 7A is a cross-sectional view of a single-level charge trap flash memory device according to an exemplary embodiment of the present invention when an erase voltage $V_E$ is applied thereto, and FIG. 7B is an energy band diagram of the single-level charge trap flash memory device shown in FIG. 7A.

Referring to FIG. 7A, if the erase voltage $V_E$ is applied to the gate 150 and the P—Si substrate 100 of the single-level charge trap flash memory device, electrons trapped into the nano-crystals 140 are emitted to the P—Si substrate 100 through Fowler-Nordheim tunneling. As the electrons are emitted, the C-V characteristic of the single-level charge trap flash memory device changes, as referred to as PROCESS 2 in FIG. 2.

Here, the memory device having the nano-crystals 140 from which the electrons are emitted is maintained in the state '1'. Thus, it is meaningless to perform an erase operation in the state '1'. That is to say, it is only effective to perform an erase operation in the state '0'.

As described above, the single-level charge trap flash memory devices according to exemplary embodiments of the present invention have nano-crystals embedded into a stacked dielectric layer consisting of a tunnel dielectric layer and an organic polymer (e.g., polyimide) thin film, thereby offering various advantages including faster write and erase operations and an extended charge retention time. In addition, the methods of fabricating the single-level charge trap flash memory devices according to exemplary embodiments the present invention provide simplified processes for forming a metal or metal oxide nano-crystals embedded in an organic polymer thin film without agglomeration through deposition or annealing. Since the nano-crystals are uniformly distributed in the organic polymer thin film without agglomeration, the size and density of the nano-crystals can be easily controlled. Additionally, according to the present invention, highly efficient, cost effective and electrochemically stable nano-crystals can be easily fabricated, compared to the prior art.

Figure 8A:
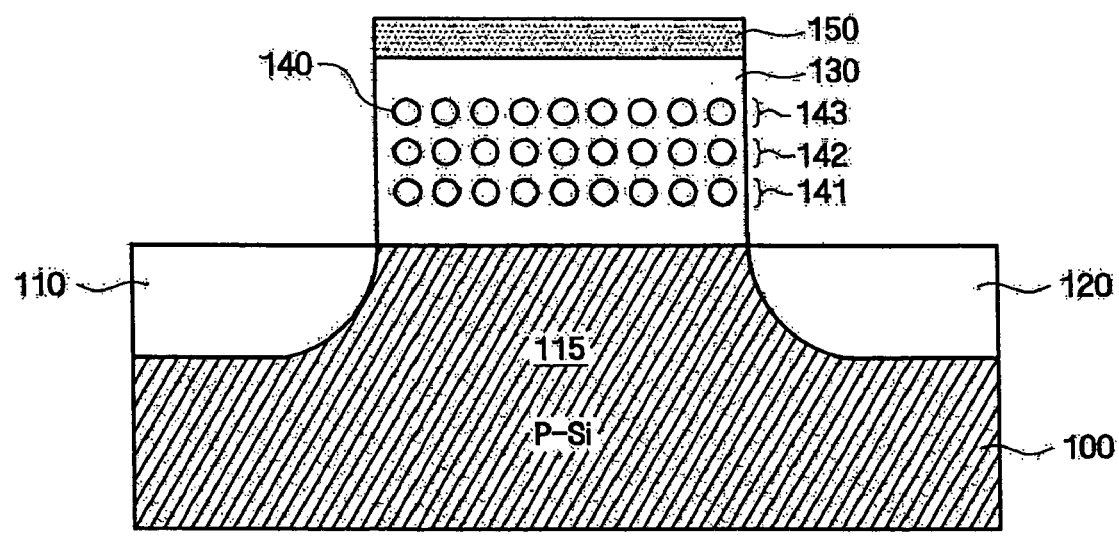
FIGS. 8A through 8C are cross-sectional views of multi-level charge trap flash memory devices according to exemplary embodiments of the present invention.
Figure 8B:
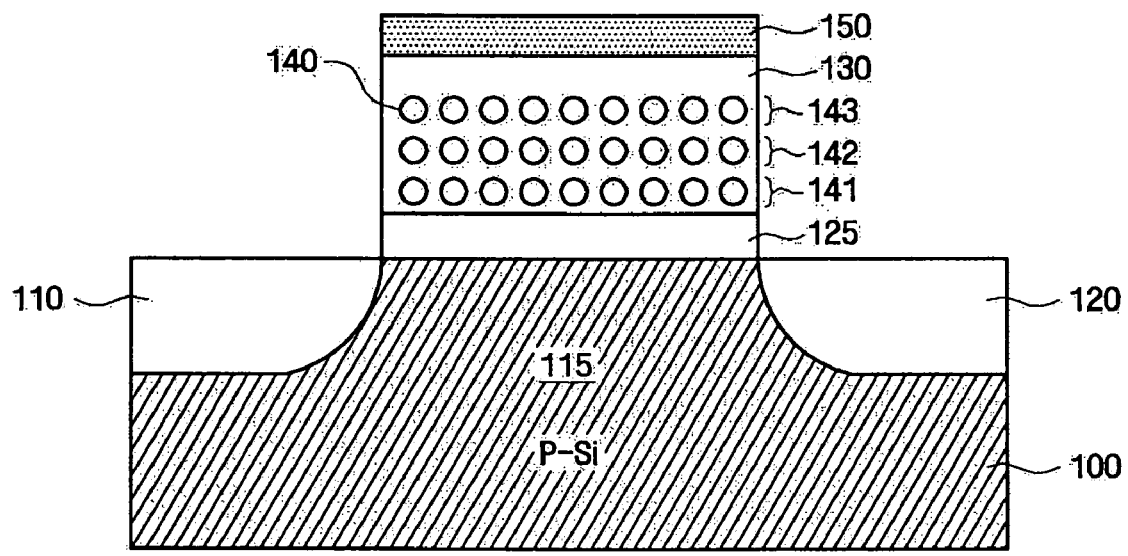
Figure 8C:
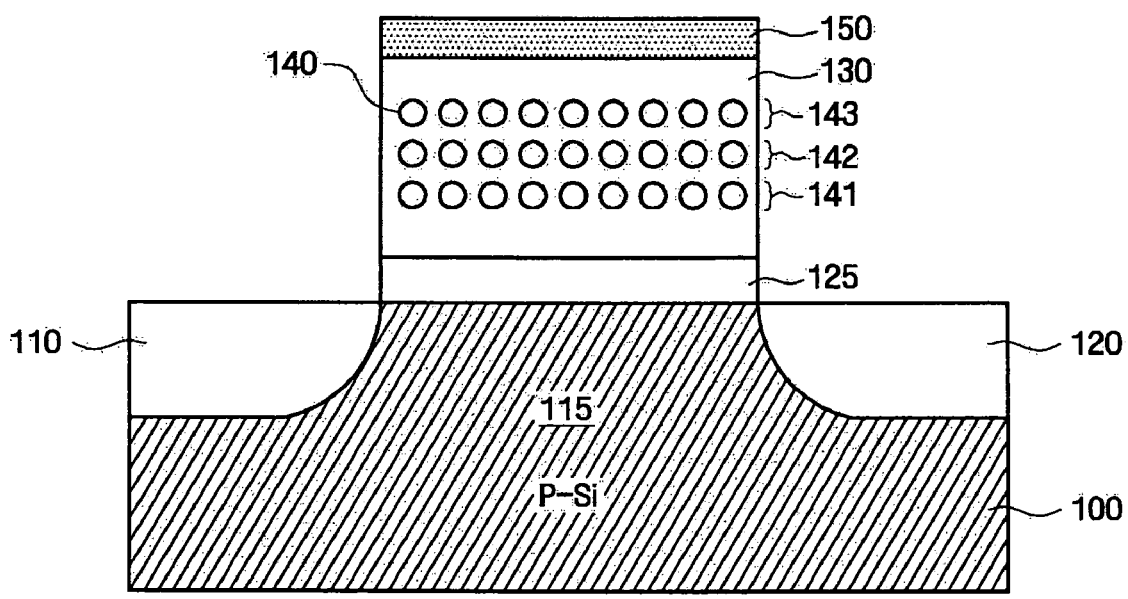

FIGS. 8A through 8C are cross-sectional views of multi-level charge trap flash memory devices according to exemplary embodiments of the present invention, in which the multi-level charge trap flash memory devices include multi-layered nano-crystals, thereby enabling multi-level (multi-bit) operations.

Referring to FIGS. 8A through 8C, the multi-level charge trap flash memory devices according to exemplary embodiments of the present invention include a substrate 100, a source region 110 and a drain region 120, a channel region 115 formed between the source region 110 and the drain region 120, an organic polymer thin film 130, a multi-layered nano-crystal 140, and a gate 150. FIG. 8A illustrates that the multi-level charge trap flash memory device includes only the organic polymer thin film 130 and FIGS. 8B and 8C illustrate that the multi-level charge trap flash memory device includes a tunneling dielectric layer 125. Referring to FIG. 8B, a first nano-crystalline layer 141 is mainly located at an interfacial area between the tunneling dielectric layer 125 and the organic polymer thin film 130. Referring to FIG. 8C, the first nano-crystalline layer 141 is spaced a predetermined distance apart from the tunneling dielectric layer 125 and is embedded into the organic polymer thin film 130.

Referring to FIGS. 8A through 8C, the multi-level charge trap flash memory devices according to exemplary embodiments of the present invention include the multilayered nano-crystals 140, thereby operating in multiple levels, unlike the single-level charge trap flash memory devices shown in FIGS. 1A and 1B. Numbers of write and read voltages corresponding to each of the multiple levels can be determined by the number of layers forming the multi-layered nano-crystals 140. While FIGS. 8A through 8C illustrate by way of example that the first nano-crystalline layer 141, a second nano-crystalline layer 142 and a third nano-crystalline layer 143 are disposed one over the other sequentially from the channel region 115 to the gate 150 in that order, the invention is not limited to the illustrated example.

The multi-level charge trap flash memory devices according to exemplary embodiments of the present invention are fabricated in the following manner. In the description that follows, the invention will be explained chiefly with regard to differences relative to the single-level charge trap flash memory devices shown in FIGS. 1A and 1B, and an explanation of the same processes or steps will not be given.

To fabricate the multi-level charge trap flash memory device shown in FIG. 8A, a metal film is first formed on the channel region 115. On the other hand, to fabricate the multi-level charge trap flash memory device shown in FIG. 8B, the tunneling dielectric layer 125 is first formed on the channel region 115 before forming the metal film. In fabricating the multi-level charge trap flash memory device shown in FIG. 8C., prior to formation of a metal film, the tunneling dielectric layer 125 and an acidic precursor film of the organic polymer thin film 130 is first formed on the channel region 115.

Subsequently, the acidic precursor film of the organic polymer thin film 130, e.g., polyamic acid, is spin-coated on the metal film and the resultant product is stored at room temperature. The resultant product may be stored at room temperature for about 24 hours, but the storage time may vary according to the kind, density and size of the nano-crystal 140 intended to be formed. After the spin-coating, storing the resultant product for a predetermined duration of time allows the nano-crystal 140 to be efficiently formed, compared to a case where the spin-coating is immediately followed by the removal of the solvent. This ensures efficient formation of nano particles while reducing the likelihood that no nano-crystals 140 will be formed, which may be caused when annealing conditions are erroneously set in a subsequent process.

Next, an annealing process is performed. In the annealing process, the precursor film of the organic polymer thin film 130 is hardened and converted into polyimide, thereby forming the first nano-crystalline layer 141 uniformly distributed in the polyimide thin film.

To form the second nano-crystalline layer 142, the above-described operation steps, including the forming of the metal film, the forming of the precursor film of the organic polymer thin film 130, the storing of the resultant product at room temperature and the performing of the annealing process, are repeatedly performed. In detail, the metal film is formed by spin sputtering, polyamic acid is spin-coated thereon, and then stored at room temperature for about 2 hours. Thereafter, polyamic acid is hardened by performing an annealing process at about 350° C. for about 2 hours under $10^{-3}$ Pa. Alternatively, the annealing process may, for example, be performed at about 400° C. for about 1 hour. As a result, the second nano-crystalline layer 142 uniformly distributed in a high density in the organic polyimide thin film 130 can be formed.

Next, the forming of the metal film, the forming of the precursor film of the organic polymer thin film 130, the storing of the resultant product at room temperature and the performing of the annealing process, are repeatedly performed, thereby forming the third nano-crystalline layer 143. While FIGS. 8B and 8C illustrate that the nano-crystals 140 are formed in three layers, that is, the first nano-crystalline layer 141, the second nano-crystalline layer 142 and the third nano-crystalline layer 143, the nano-crystals 140 may be formed in more than three layers by repeatedly performing the above-described operation steps, that is, the forming of the metal film, the forming of the precursor film of the organic polymer thin film 130, the storing of the resultant product at room temperature and the performing of the annealing process.

Like in the single-level charge trap flash memory devices according to exemplary embodiments of the present invention, the multi-layered nano-crystals 140 may be made of zinc oxide, copper oxide or nickel iron. Specifically, when nickel iron is used as a material for forming the nano-crystals, formation of multiple layers is facilitated.

Next, patterning of the organic polymer thin film 130 having the first through third nano-crystalline layers 141, 142 and 143 embedded therein and forming of the source 110, the drain 120 and the gate 150 can be performed in various manners using methods and processes well known to one skilled in the art.

Figure 9:
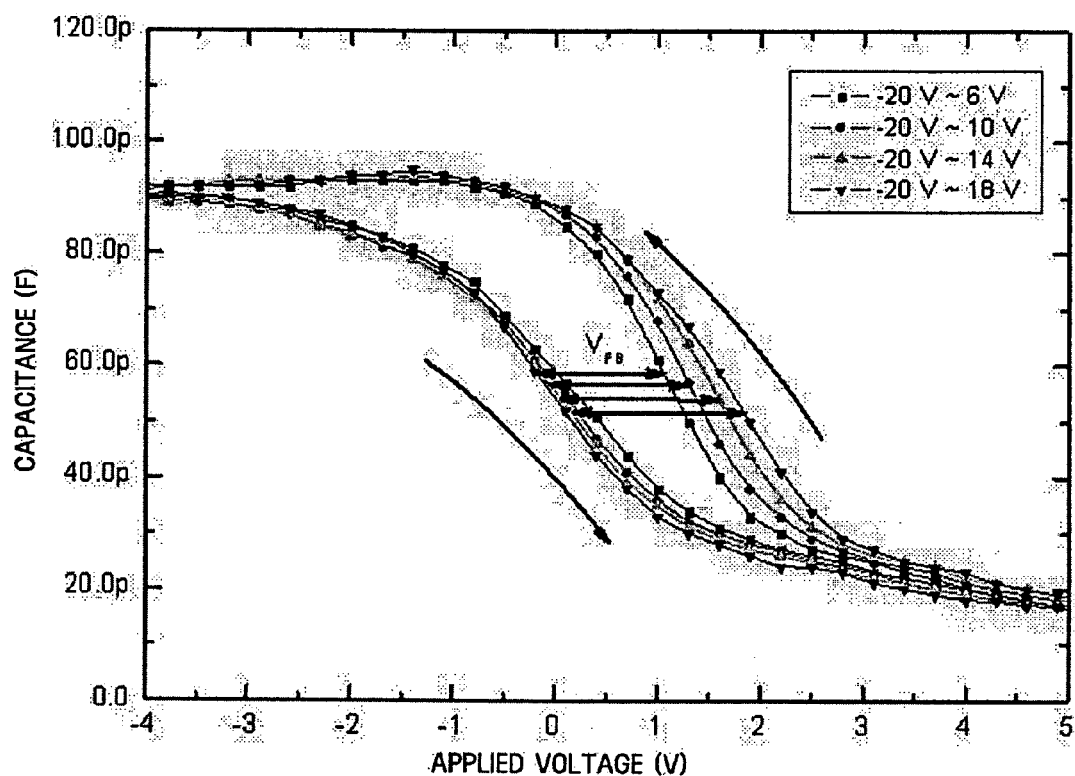
FIG. 9 is a graph illustrating capacitance-versus-voltage (C-V) characteristic curves associated with write, read and erase operations in a multi-level charge trap flash memory device according to an exemplary embodiment of the present invention.

FIG. 9 is a graph illustrating the capacitance-versus-voltage (C-V) characteristic curve associated with write, read and erase operations in a multi-level charge trap flash memory device fabricated according to an exemplary embodiment of the present invention. As shown in FIG. 9, when a voltage V is applied to the multi-level charge trap flash memory device in a forward direction, the $\Box V_{FB}$ is 2 V.

The operation principle of the multi-level charge trap flash memory device shown in FIG. 8A will now be described. A write operation of the multi-level charge trap flash memory device will first be described with reference to FIGS. 10A through 13B, an erase operation thereof will then be described with reference to FIGS. 14A and 14B, and a read operation thereof will next be described with reference to FIGS. 15A through 18B. The operation principle of the multi-level charge trap flash memory device shown in FIG. 9 will be described with regard to the first through third nano-crystalline layers 141 through 143, but the invention is not limited thereto.

Figure 10A:
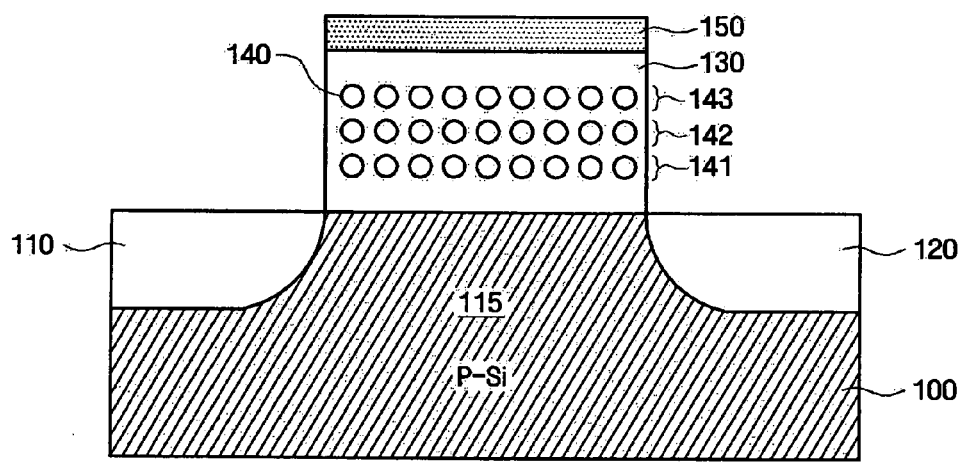
FIGS. 10A, 11A, 12A, 13A, 14A, 15A, 16A, 17A and 18A are cross-sectional views for describing write, read and erase operations in a multi-level charge trap flash memory device according to an exemplary embodiment of the present invention.
Figure 10B:
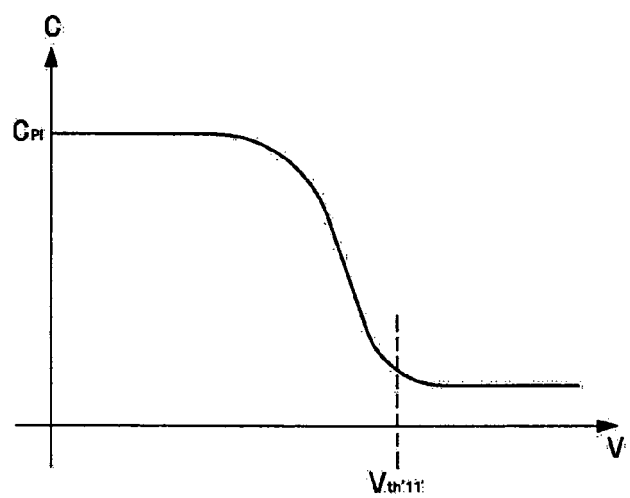
FIGS. 10B, 11B, 12B, 13B, 14B, 15B, 16B, 17B and 18B are C-V characteristic curves for describing the write, read and erase operations associated with FIGS. 10A, 11A, 12A, 13A, 14A, 15A, 16A, 17A and 18A, respectively.

In detail, FIG. 10A illustrates the initial operation of a multi-level charge trap flash memory device according to an exemplary embodiment of the present invention, and FIG. 10B is a graph illustrating the C-V characteristic curve of the multi-level charge trap flash memory device shown in FIG. 10A.

Referring to FIG. 10A, initially, no electrons are trapped into first through third nano-crystalline layers 141 through 143 in the organic polymer (e.g., polyimide) thin film 130. In this case, the C-V characteristic curve shows characteristics exhibited by a typical metal-insulator-semiconductor (MIS) structure, as shown in FIG. 3B. In this way, the state where no hysteresis appears to the C-V characteristic due to an absence of the electrons trapped in the nano-crystals 140 is defined as '11'. To enable write operations of states '10', '01' and '00', the multi-level charge trap flash memory device should be initialized to the state '11'.

Figure 11A:
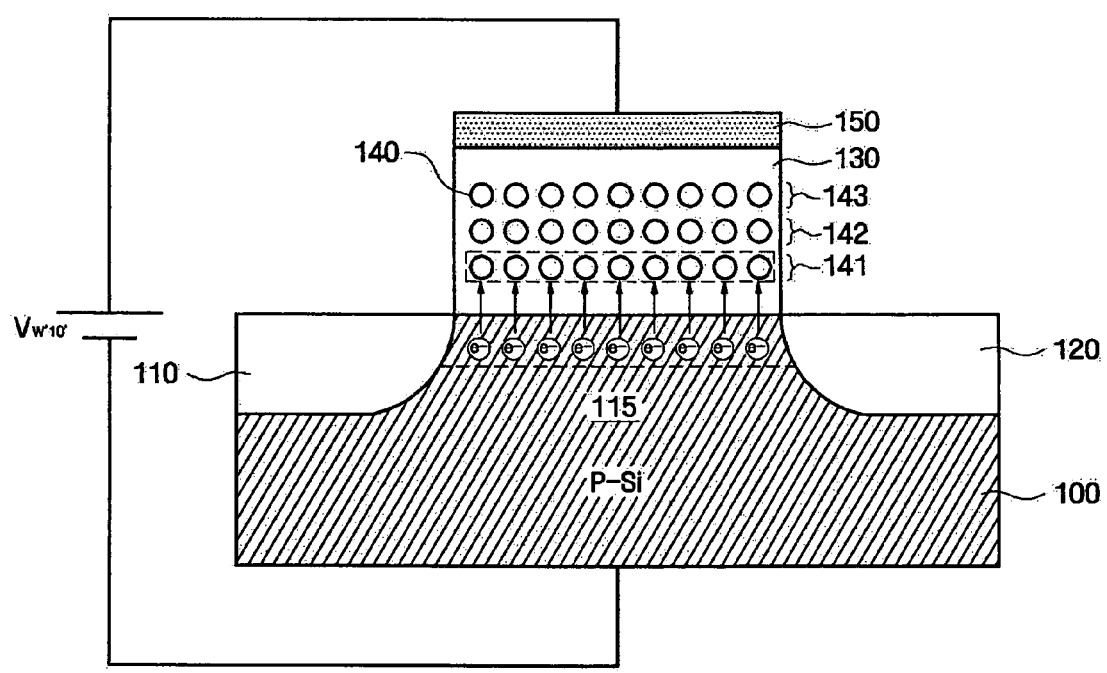
Figure 11B:
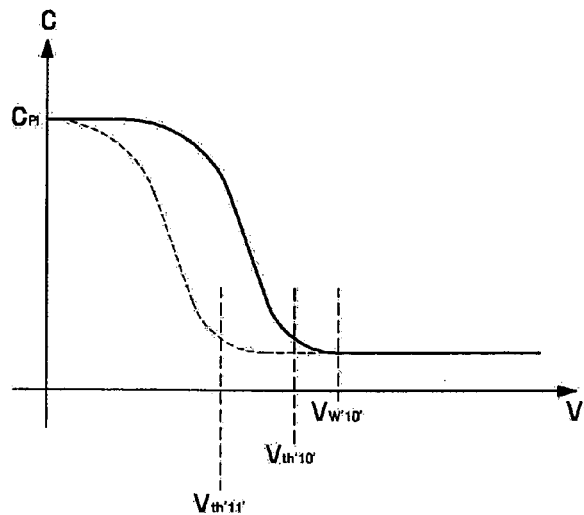

FIG. 11A illustrates the initial operation of a multi-level charge trap flash memory device according to an exemplary embodiment of the present invention, and FIG. 11B is a graph illustrating the C-V characteristic curve of the multi-level charge trap flash memory device shown in FIG. 11A.

Referring to FIG. 11A, in order to write the state '10' in the memory device initialized to the state '11', the source region 110 and the drain 120 is floated and a write voltage $V_{W`10`}$ for writing the state '10' in the memory device is applied to the gate 150 of the memory device. When the write voltage $V_{W`10`}$ is applied to the memory device, electrons formed in an inversion layer of the P—Si substrate 100 are injected into the organic polymer thin film 130 by tunneling. Then, the injected electrons are trapped into the lowest layer, that is, the first nano-crystalline layer 141. Since the write voltage $V_{W`10`}$ is smaller than the write voltage of the other state '01' or '00', the injected electrons cannot be trapped into the second nano-crystalline layer 142 and/or the third nano-crystalline layer 143 and most of the injected electrons can only be trapped into the first nano-crystalline layer 141.

Referring to FIG. 11B, the initial C-V characteristic curve is shifted in a forward direction due to an internal electric field generated by the electrons trapped into the first nano-crystalline layer 141. Accordingly, a threshold voltage of the memory device changes. That is to say, the threshold voltage of the memory device changes from an initial threshold voltage $V_{th`11`}$ to $V_{th`10`}$, so that a write operation of the state '10' is performed and the state '10' is stored in the memory device.

Figure 12A:
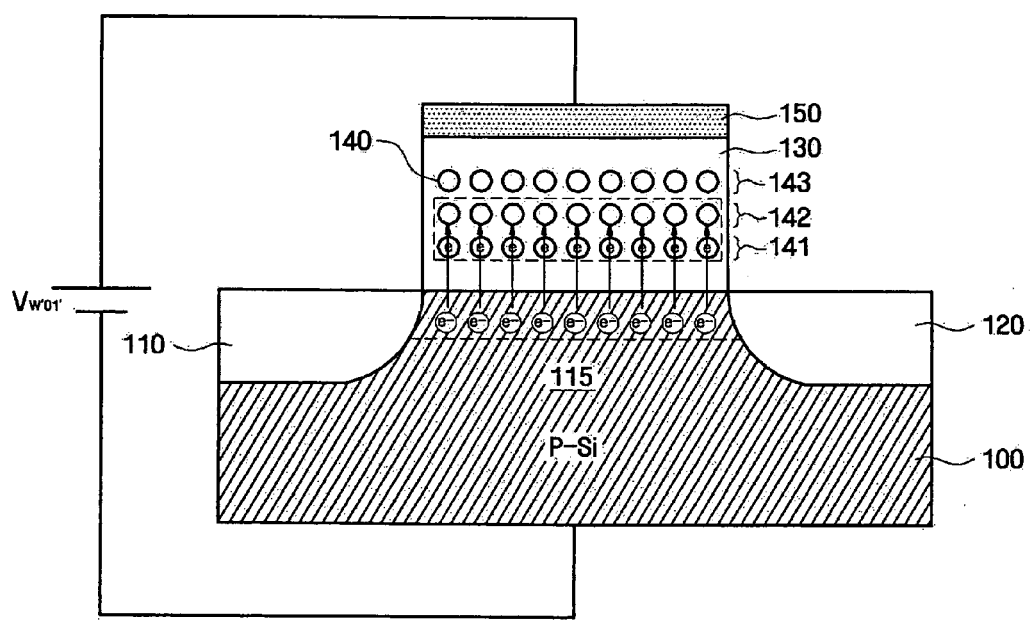
Figure 12B:
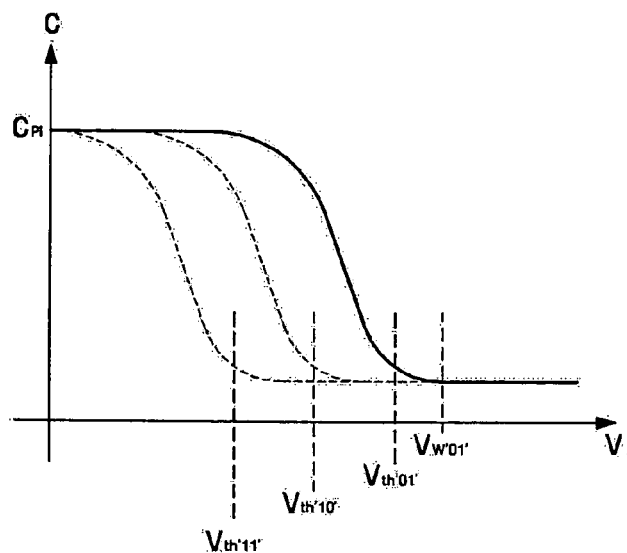

FIG. 12A illustrates the operation of a multi-level charge trap flash memory device according to an exemplary embodiment of the present invention when a write voltage $V_{W`01`}$ of the state '01' is applied thereto and FIG. 12B is a graph illustrating the C-V characteristic curve of the multi-level charge trap flash memory device shown in FIG. 12A.

Referring to FIG. 12A, in order to write the state '01' in the memory device, the write voltage $V_{W`01`}$ for writing the state '01' in the memory device is applied to the gate 150 of the memory device. The general operation of the memory device is substantially the same as that in the case of the state '10'. However, since the write voltage $V_{W`01`}$ is higher than $V_{W`10`}$, electrons formed in an inversion layer can be trapped into the first nano-crystalline layer 141 and the second nano-crystalline layer 142 of the nano-crystals 140 which is spontaneously formed in the organic polymer thin film 130.

Referring to FIG. 12B, the initial C-V characteristic curve is shifted in a forward direction. In addition, since a quantity of electrons trapped into the nano-crystal 140 is larger than in the state '10', the initial C-V characteristic curve is shifted to a greater degree than in the state '10'. Accordingly, a threshold voltage of the memory device changes from an initial threshold voltage $V_{th`11`}$ to $V_{th`01`}$, so that a write operation of the state '01' is performed and the state '01' is stored in the memory device.

Figure 13A:
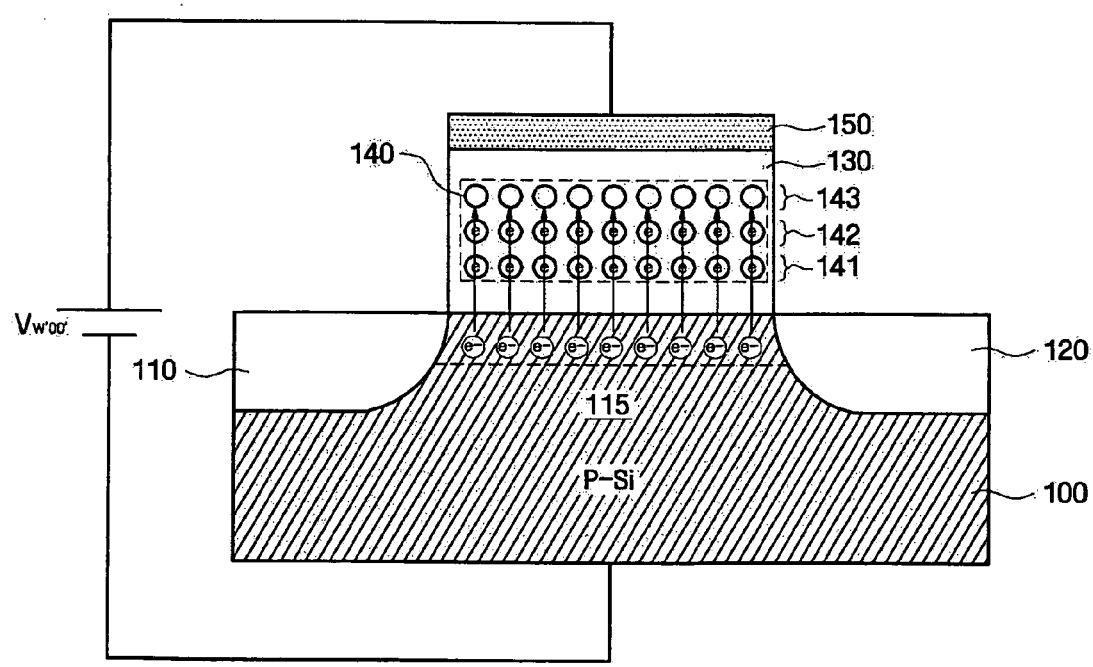
Figure 13B:
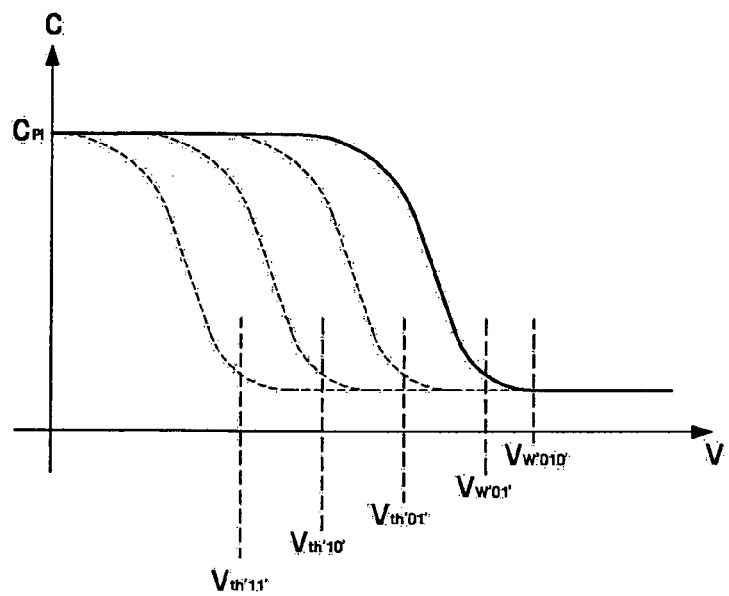

FIG. 13A illustrates the operation of a multi-level charge trap flash memory device according to an exemplary embodiment of the present invention when a write voltage $V_{W`00`}$ of the state '00' is applied thereto and FIG. 13B is a graph illustrating the C-V characteristic curve of the multi-level charge trap flash memory device shown in FIG. 13A.

Referring to FIG. 13A, in order to write the state '00' in the memory device, the write voltage $V_{W`00`}$ for writing the state '00' in the memory device is applied to the gate 150 of the memory device. The general operation of the memory device is substantially the same as that in the cases of the states '10' and '01'. The write voltage $V_{W`00`}$ is high enough to allow electrons formed in an inversion layer to be trapped into all of the first through third nano-crystalline layers 141 through 143.

Referring to FIG. 13B, the initial C-V characteristic curve is also shifted in a forward direction and a shift range is largest in all the cases for the respective states. A threshold voltage of the memory device changes from an initial threshold voltage $V_{th'11'}$ to $V_{th'00'}$, so that a write operation of the state '00' is performed and the state '00' is stored in the memory device.

Figure 14A:
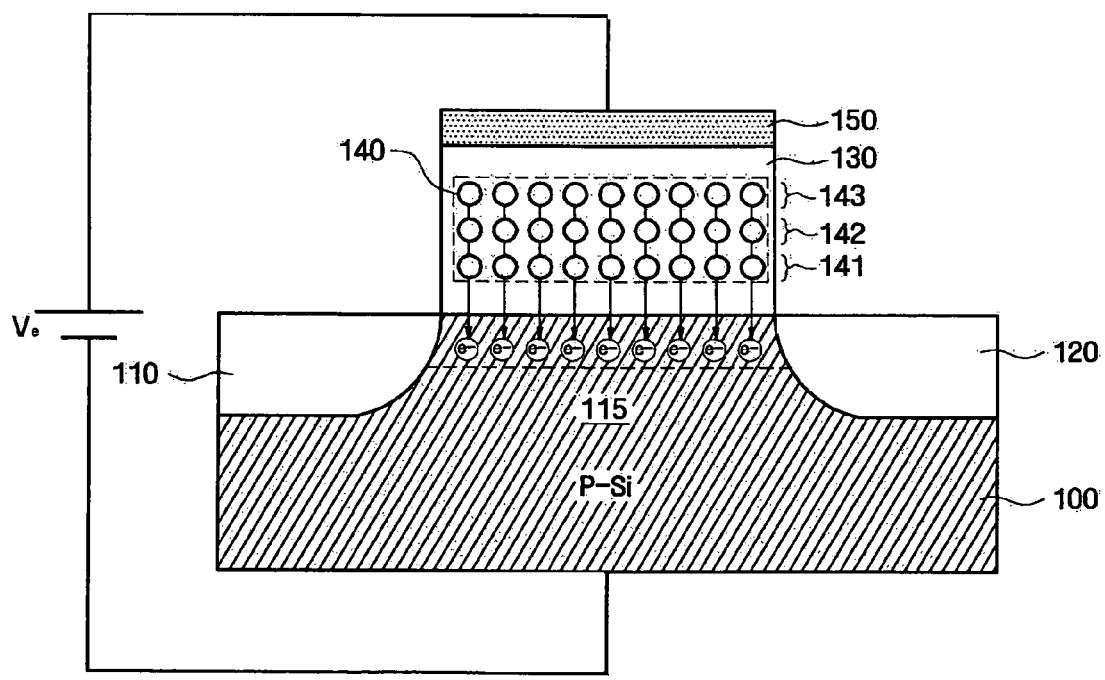
Figure 14B:
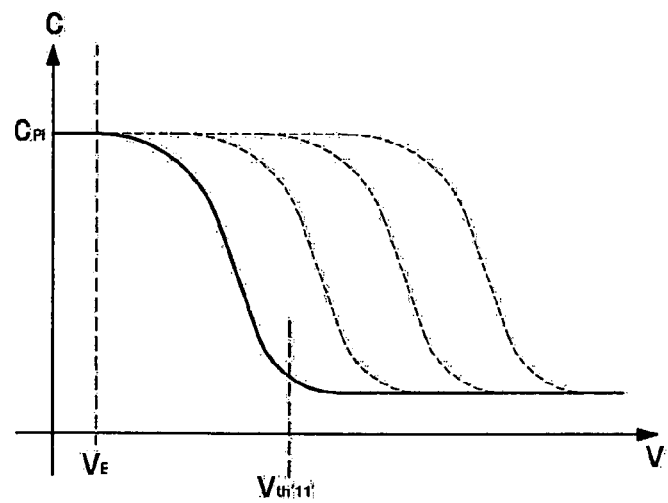

FIG. 14A illustrates the operation of a multi-level charge trap flash memory device according to an exemplary embodiment of the present invention when an erase voltage $V_E$ is applied thereto, and FIG. 14B is a graph illustrating the C-V characteristic curve of the multi-level charge trap flash memory device shown in FIG. 14A.

Referring to FIG. 14A, in order to initialize the memory device to a state '11' by performing an erase operation on the memory device, power externally supplied to the source region 110 and the drain 120 is floated and an erase voltage $V_E$ is applied to the gate 150 of the memory device in a direction opposite to the write voltage. When the erase voltage $V_E$ is applied to the memory device, the electrons trapped into the first through third nano-crystalline layers 141 through 143 are emitted to the P—Si substrate 100.

Referring to FIG. 14B, if the electrons trapped into the first through third nano-crystalline layers 141 through 143 are emitted to the P—Si substrate 100, the hysteresis characteristic disappears from the C-V characteristic curve, irrespective of the state stored in the memory device, like the C-V characteristic curve shown in FIG. 10B. The state where no hysteresis characteristic occurs to the memory device is determined as being initialized. In this case, the memory device will return to the state '11'.

Figure 15A:
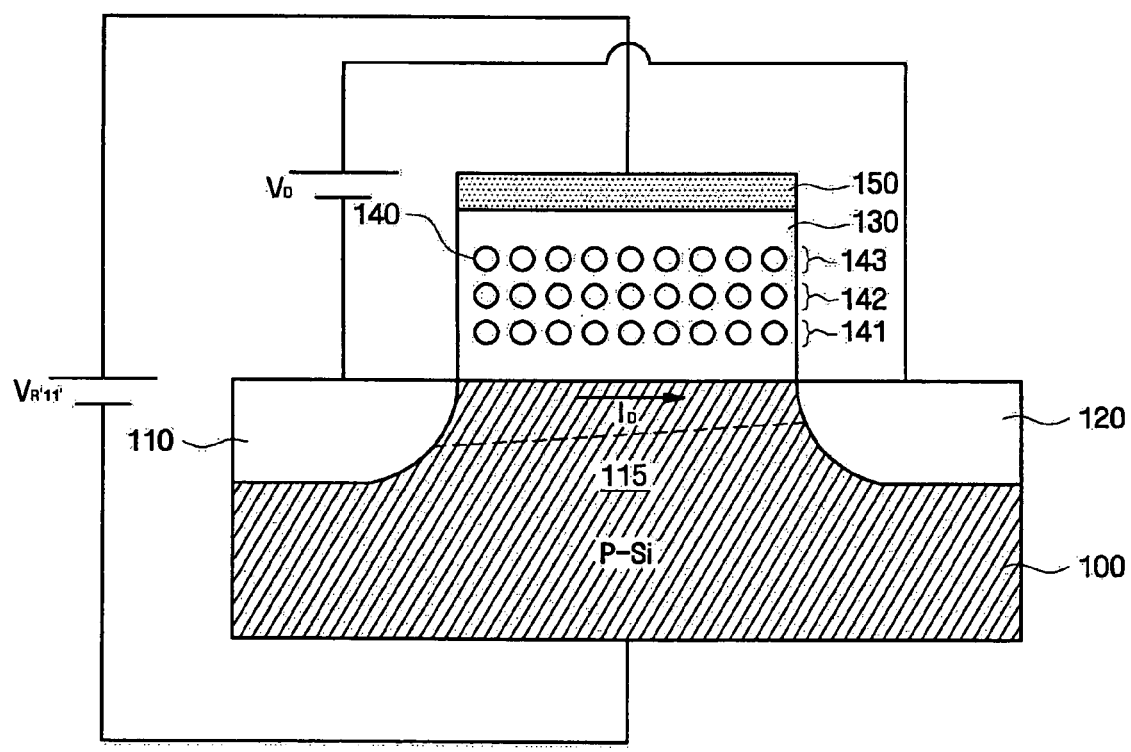
Figure 15B:
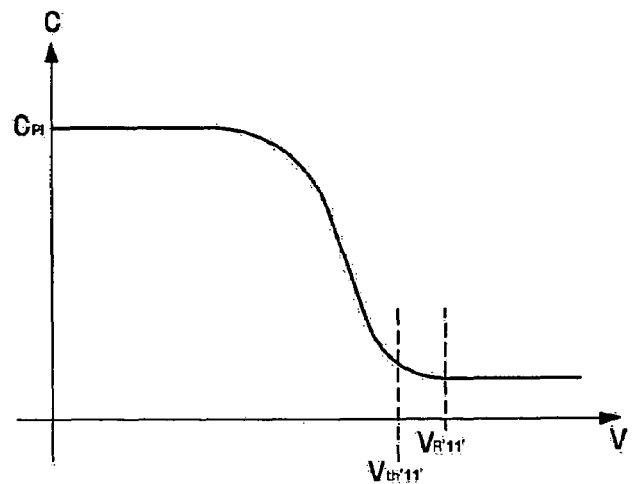

FIG. 15A illustrates the operation of a multi-level charge trap flash memory device according to an exemplary embodiment of the present invention when a read voltage $V_{R'11'}$ for reading the state '11' is applied thereto, and FIG. 15B is a graph illustrating the C-V characteristic curve of the multi-level charge trap flash memory device shown in FIG. 15A.

Referring to FIGS. 15A and 15B, in order to read the state '11' of the initialized memory device, a predetermined voltage $V_D$ is applied to a source region 110 and a drain region 120 and the read voltage $V_{R'11'}$ is applied to a gate 150. In the state '11', electrons are not trapped into first through third nano-crystalline layers 141 through 143 at all. In addition, since the read voltage $V_{R'11'}$ is larger a threshold voltage $V_{th'11'}$ of the state '11', a channel is formed in the P—Si substrate 100 and a drain current $I_D$ flows through the channel. The drain current $I_D$ is detected by a driving circuit and a storage state of the memory device is determined as '11'.

Figure 16A:
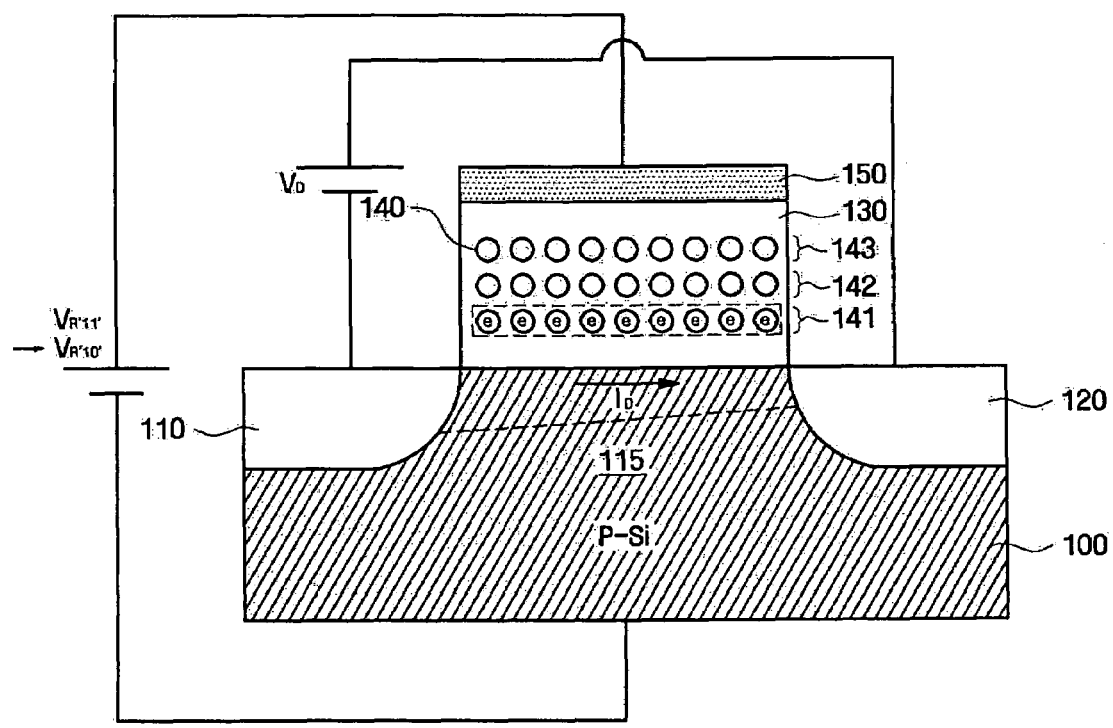
Figure 16B:
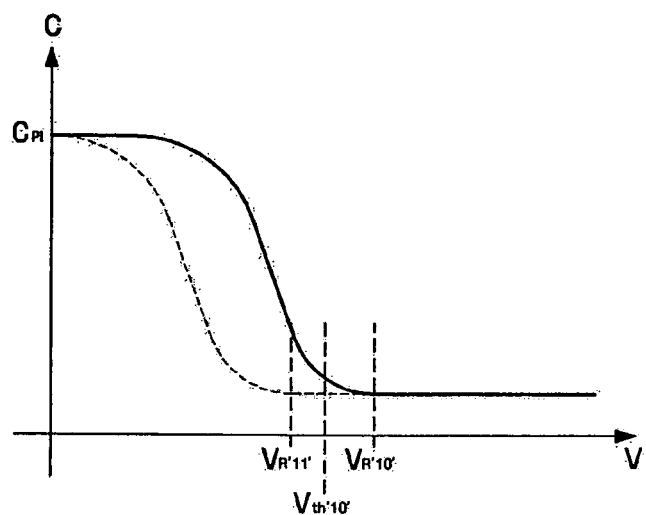

FIG. 16A illustrates the operation of a multi-level charge trap flash memory device according to an exemplary embodiment of the present invention when a read voltage $V_{R'10'}$ for reading the state '10' is applied thereto, and FIG. 16B is a graph illustrating the C-V characteristic curve of the multi-level charge trap flash memory device shown in FIG. 16A.

Referring to FIGS. 16A and 16B, in a case where the state '10' is stored in the memory device, a threshold voltage $V_{th'10'}$ of the state '10' is larger than the read voltage $V_{R'11'}$ of the state '11'. Accordingly, when the read voltage $V_{R'11'}$ is applied to the device, a channel is not formed in the P—Si substrate 100 and a drain current $I_D$ cannot flow. If no drain current is detected at the read voltage $V_{R'11'}$, the driving circuit applies a higher read voltage $V_{R'10'}$ to a gate 150. The read voltage $V_{R'10'}$ is greater than threshold voltage $V_{th'10'}$ of the state '10'. Thus, the drain current $I_D$ flows and the driving circuit detects that the drain current $I_D$ flows. When a drain current $I_D$ flows at the read voltage $V_{R'10'}$ while no data current flows at the read voltage $V_{R'11'}$, the driving circuit determines the storage state of the memory device corresponding to this situation as '10'.

Figure 17A:
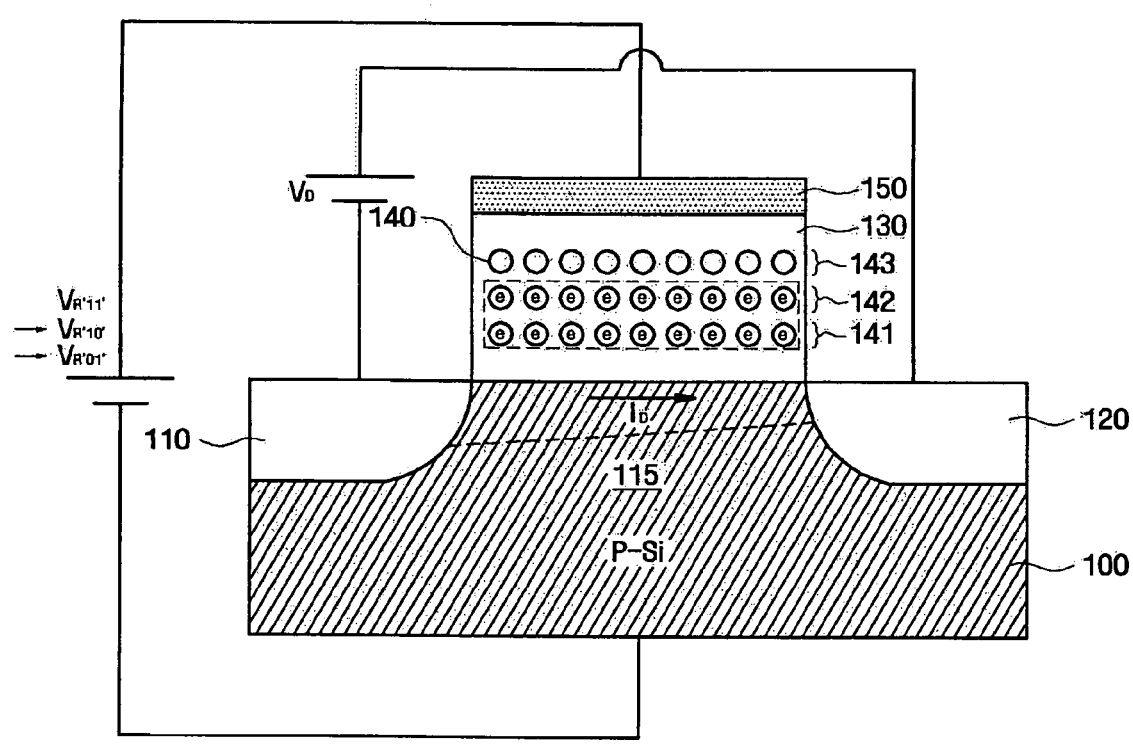
Figure 17B:
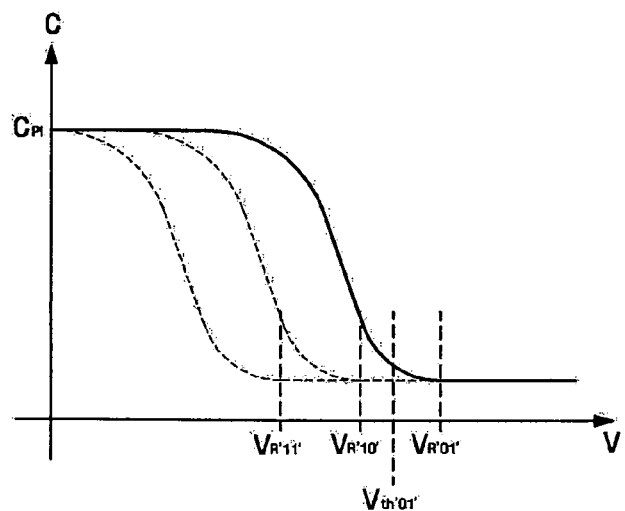

FIG. 17A illustrates the operation of a multi-level charge trap flash memory device according to an exemplary embodiment of the present invention when a read voltage $V_{R'01'}$ for reading the state '01' is applied thereto, and FIG. 17B is a graph illustrating the C-V characteristic curve of the multi-level charge trap flash memory device shown in FIG. 17A.

Referring to FIGS. 17A and 17B, in a case where the state '01' is stored in the memory device, a threshold voltage $V_{th'01'}$ of the state '01' is larger than the read voltage $V_{R'10'}$ of the state '10'. Accordingly, a drain current $I_D$ cannot flow. Thus, in order to make the drain current $I_D$ flow, it is necessary to apply the higher read voltage $V_{R'01'}$ to the gate 150. If no drain current is detected at the read voltages $V_{R'11'}$ and $V_{R'10'}$, the driving circuit applies the higher read voltage $V_{R'01'}$ to the gate 150, thereby making the drain current $I_D$ flow.

If no drain current is detected at the read voltage $V_{R'11'}$, the driving circuit sequentially applies the read voltage $V_{R'10'}$ to the gate 150. If no drain current is yet detected, the driving circuit applies the read voltage $V_{R'01'}$ to the gate 15, thereby making the drain current $I_D$ flow. Here, the driving circuit determines the storage state of the memory device corresponding to this situation as '01'.

Figure 18A:
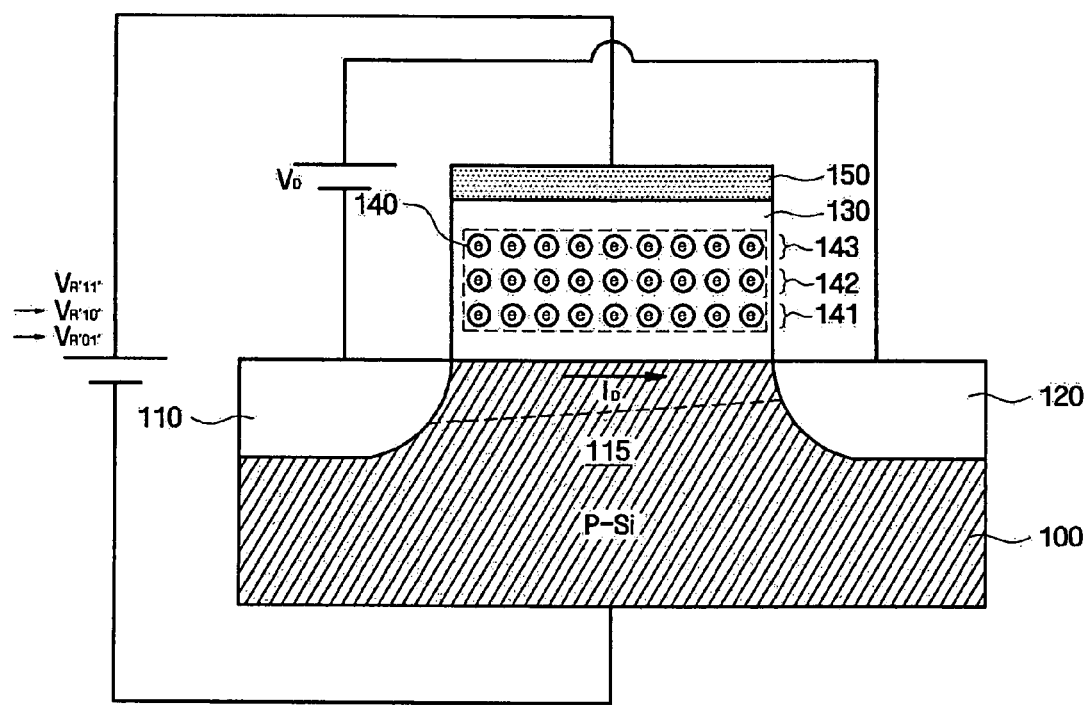
Figure 18B:
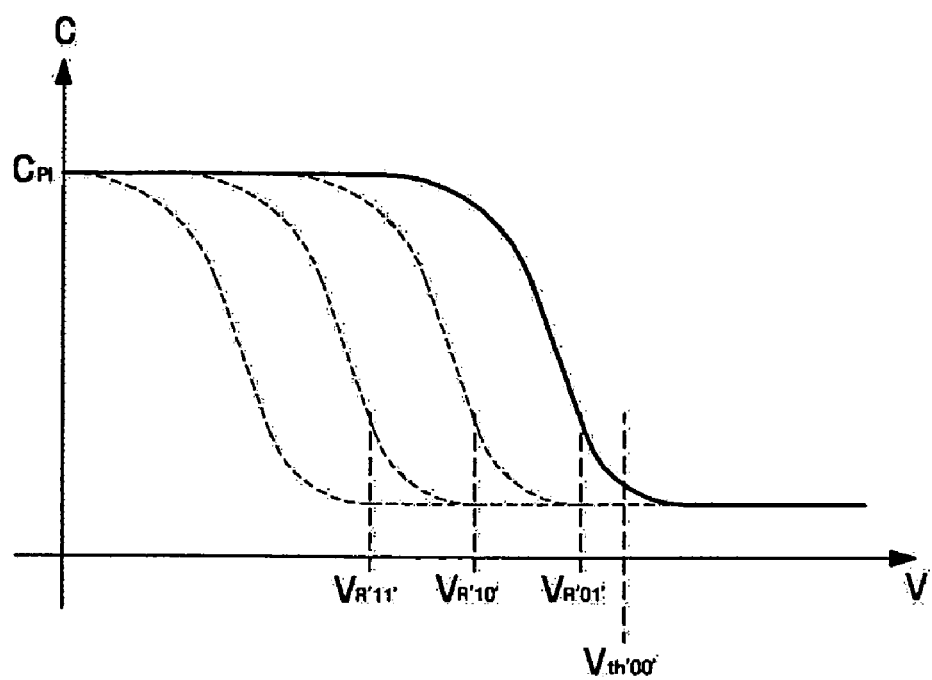

FIG. 18A illustrates the operation of a multi-level charge trap flash memory device according to an exemplary embodiment of the present invention when a read voltage $V_{R'01'}$ for reading the state '00' is applied thereto, and FIG. 18B is a graph illustrating the C-V characteristic curve of the multi-level charge trap flash memory device shown in FIG. 18A.

Referring to FIGS. 18A and 18B, in a case where the state '00' is stored in the memory device, a threshold voltage $V_{th'00'}$ of the state '00' is larger than the largest read voltage $V_{R'01'}$ of the memory device. Accordingly, a drain current $I_D$ cannot flow.

If no drain current is detected at the read voltage $V_{R'11'}$, the driving circuit sequentially applies the read voltage $V_{R'10'}$ to the gate 150. If no drain current is yet detected, the driving circuit applies the read voltage $V_{R'01'}$ to the gate 150. If no drain current is yet detected at all of the read voltages, the driving circuit determines the storage state of the memory device corresponding to this situation as '00'.

Figure 19:
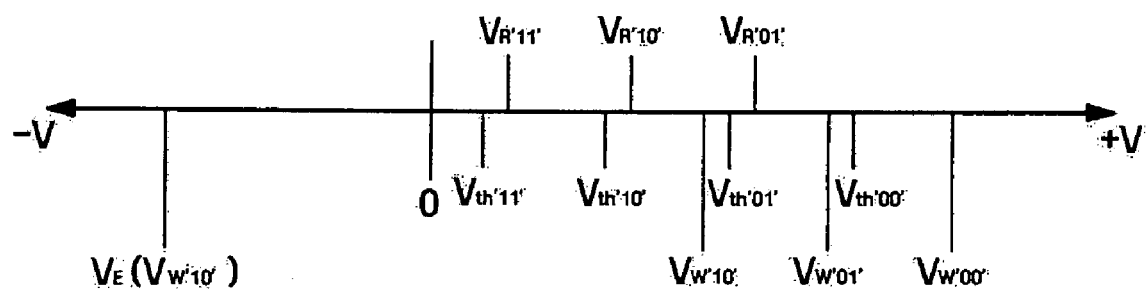
FIG. 19 is a diagram illustrating examples of relative magnitudes of write, read, erase and threshold voltages for various operational states described in connection with FIGS. 10A through 18B.

FIG. 19 is a diagram illustrating relative magnitudes of write, read, erase and threshold voltages for various states in the multi-level charge trap flash memory device shown in FIGS. 10 through 18. As illustrated in FIG. 19, during the operation of the memory device, it is necessary to apply appropriate gate voltages corresponding to the respective states to the memory device.

According to the exemplary embodiment of present invention, since nano-crystals are uniformly distributed in a polyimide thin film without agglomeration, the size and density of the nano-crystals can be easily controlled and thus multilayered nano-crystals can be easily formed.

In addition, since a threshold voltage can be easily adjusted simply by changing a write voltage using a quantity of electrons trapped and/or emitted into/from each nano-crystalline layer, it is possible to fabricate multi-level nano-crystal charge trap flash memory devices capable of operating in multiple levels in a desired range of voltages applied.

While the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A method of fabricating a charge trap flash memory device, the method comprising:
forming a tunneling dielectric layer on a semiconductor substrate;
forming an organic polymer thin film on the tunneling dielectric layer, the organic polymer thin film comprising embedded metal or metal oxide nano-crystals for trapping charges;
forming a gate layer on the organic polymer thin film; and
patterning the gate layer, the organic polymer thin film and the tunneling dielectric layer, and forming source and drain regions in the semiconductor substrate.

2. The method of claim 1, wherein the tunneling dielectric layer is formed of silicon oxide.

3. A method of fabricating a charge trap flash memory device, the method comprising:
forming a tunneling dielectric layer on a semiconductor substrate;
forming an organic polymer thin film on the tunneling dielectric layer, the organic polymer thin film comprising embedded metal or metal oxide nano-crystals;
forming a gate layer on the organic polymer thin film; and
patterning the gate layer, the organic polymer thin film and the tunneling dielectric layer, and forming source and drain regions in the semiconductor substrate,
wherein forming the organic polymer thin film comprises:
forming a metal film on the tunneling dielectric layer;
forming an acidic precursor film of organic polymer on the metal film to obtain a resultant product; and
annealing the resultant product to form the organic polymer thin film comprising the embedded metal or metal oxide nano-crystals.

4. The method of claim 3, further comprising:
storing the acidic precursor film at room temperature prior to the annealing of the resultant product.

5. The method of claim 3, further comprising:
prior to the forming of the metal film, forming the acidic precursor film of organic polymer and removing a solvent from the acidic precursor film.

6. The method of claim 3, wherein the organic polymer thin film is a polyimide thin film.

7. The method of claim 3, wherein the metal or metal oxide nano-crystals include at least one of zinc oxide, copper oxide and nickel iron.

8. The method of claim 3, wherein the acidic precursor film is formed of a material prepared by dissolving biphenyltetracaboxylic dianhydide in a solvent selected from the group consisting of N-metyl-2-pyrrolidone (NMP), water, N-dimethylacetamide, and diglyme.

9. A method of fabricating a charge trap flash memory device, the method comprising:
forming a tunneling dielectric layer on a semiconductor substrate;
forming an organic polymer thin film on the tunneling dielectric layer, the organic polymer thin film comprising embedded multiple layers of metal or metal oxide nano-crystals for trapping charges;
forming a gate layer on the organic polymer thin film; and
patterning the gate layer and the organic polymer thin film, and forming source and drain regions in the semiconductor substrate.

10. The method of claim 9, wherein forming the organic polymer thin film comprises:
forming an acidic precursor film of organic polymer on the tunneling dielectric layer and removing a solvent from the acidic precursor film;
forming a metal film on the acidic precursor film;
forming an acidic precursor film of organic polymer on the metal film to obtain a resultant product;
annealing the resultant product; and
repeatedly performing at least twice the forming of the metal film, the forming of the acidic precursor film, and the annealing of the resultant product.

11. The method of claim 10, further comprising:
storing the resultant product at room temperature prior to the annealing of the resultant product.

12. The method of claim 10, wherein the organic polymer thin film is a polyimide thin film.

13. The method of claim 10, wherein the metal or metal oxide nano-crystals include at least one of zinc oxide, copper oxide and nickel iron.

14. The method of claim 10, wherein the acidic precursor film is formed of a material prepared by dissolving biphenyltetracaboxylic dianhydide in a solvent selected from the group consisting of N-methyl-2-pyrrolidone (NMP), water, N-dimethylacetamide, and diglyme.

15. The method of claim 9, wherein the nano-crystals are nickel iron nano-crystals.

16. The method of claim 1, wherein the organic polymer thin film comprises a polyimide thin film.

17. The method of claim 16, wherein the metal or metal oxide nano-crystals comprise at least one of zinc oxide, copper oxide and nickel iron.

* * * * *